United States Patent [19]

Bölkow et al.

[11] Patent Number: 4,569,599

[45] Date of Patent: Feb. 11, 1986

[54] METHOD OF DETERMINING THE DIFFERENCE BETWEEN THE TRANSIT TIMES OF MEASURING PULSE SIGNALS AND REFERENCE PULSE SIGNALS

[75] Inventors: Ludwig Bölkow, Oberfeldallee 9, D-8022 Grünwald; Walter Mehnert, Ottobrunn; Hoiko Chaborski, Munich, all of Fed. Rep. of Germany

[73] Assignee: Ludwig Bölkow, Grunwald, Fed. Rep. of Germany

[21] Appl. No.: 488,779

[22] Filed: Apr. 26, 1983

[30] Foreign Application Priority Data

Apr. 28, 1982 [DE] Fed. Rep. of Germany ....... 3215847

[51] Int. Cl.[4] .............................................. G01C 3/08
[52] U.S. Cl. ....................................... 368/120; 356/5; 343/12 R
[58] Field of Search ..................... 356/4, 5; 343/12 R; 368/118–123

[56] References Cited

U.S. PATENT DOCUMENTS 3,728,025  4/1973  Madigan et al. ..................... 356/5
4,139,301  2/1979  Chaborski ......................... 343/12 R
4,181,431  1/1980  Chaborski ......................... 343/12 R

FOREIGN PATENT DOCUMENTS 92676  11/1983  European Pat. Off. ................ 356/5
3216313  3/1983  Fed. Rep. of Germany .......... 356/5

Primary Examiner—Bernard Roskoski

[57] ABSTRACT

The invention provides a method and an apparatus for determining the difference between the transit times of measuring pulse signals from a transmitter to a receiver along a measuring signal path establishing an unknown time of travel which is representative for a physical quantity of interest, and the transit times of reference pulse signals generated by the same transmitter and forwarded to the same receiver along a reference signal path establishing a known, constant time of travel, whereby for the measurement of each of said transit times the time distance between a trigger signal triggering the generation of the respective measuring pulse or reference pulse signal and a time-significant signal is measured which is generated in a defined time relation to the instant at which the respective pulse signal is received by said receiver. Both average values comprise non-linearity errors to the same extent so that these errors are eliminated when the second one of these average values is subtracted from the first one.

23 Claims, 5 Drawing Figures

METHOD OF DETERMINING THE DIFFERENCE BETWEEN THE TRANSIT TIMES OF MEASURING PULSE SIGNALS AND REFERENCE PULSE SIGNALS

FIELD OF THE INVENTION

The invention relates to a method of determining the difference between the transit time of measuring pulse signals and reference pulse signals.

BACKGROUND OF THE INVENTION

In German Patent No. 30 12 186 a time measurement method is disclosed in which the time distance of two repeatable time-significant signals is to be determined as accurately as possible. The measurement value concerned is obtained not directly, but by calculation from three individual measurement values, a so-called coarse measurement value and two so-called precision measurement values. In that case, the coarse measurement value is obtained by counting the waveform periods of a time base signal, which occur between both the time-significant signals. The time base signal is delivered by a free-running, quartz-controlled oscillator, i.e. by an oscillator which is not at all correlated or synchronised with both of the time-significant signals. Both the precision or fine measurement values, which each represent the time distance of the earlier or later time-significant signal from the beginning (or end) of a succeeding, for example of the beginning of the next waveform period of the time base signal, are measured in analog manner with the aid of one and the same time-to-amplitude converter circuit and, after an analog-to-digital conversion has taken place, combined correctly in sign with the coarse measurement value for the calculation of the overall measurement value of interest. In the normal case, this means that one of both the fine measurement values is added to the coarse measurement value and the other is subtracted from the coarse measurement value so that altogether the difference between the two fine measurement values, enters into the measurement result actually of interest. In that case, the rising, or the falling edges of a rectangularly shaped time base signal or corresponding zero transitions of a sinusoidal time base signal can serve as reference points marking the beginning or the end of a waveform period.

A typical example of application for this known time measurement method is represented for example by distance measurement methods on the principle of the transit time measurement of a light pulse, in which the light pulse emitted by a transmitting light source is divided up within the measuring device into a measurement light pulse and a reference light pulse, wherein the first is emitted through the optical transmitting system towards the target object, is reflected from there to the measuring device and forwarded in the measuring device to a light receiver which has previously received the reference light pulse through a short reference light path, internal to the device, of known length. Both light pulses initiate in the receiving channel following the light receiver two signals which represent the time-significant signals of the above mentioned time measurement method and the time distance of which is a measure of the distance of the target object. Because of the normally different length of the reference light path and of the measurement light path, each of both these initially simultaneously generated individual signals is subject to an own time of travel which differs from that of the other signal. As long as however the distance between the target object and the distance measuring device does not change, the times of travel of both these signals also remain unchanged, so that repeatedly both kinds of light pulses can be generated for repeatedly measuring the difference of their transit times.

Another possibility of application of the above mentioned time measurement method is the measurement of the phase displacement between two periodic signals of the same frequency. If one for example assumes that periodic rectangular signals are concerned in the case, then two rising edges, following one upon the other within a period length, of the one and of the other periodic signal are the repeatable individual signals and the phase displacement between both the periodic signals can be measured in that one measures the time distances of these repeatable individual signals from a following defined, for example the next rising edge of a time base signal possessing the same frequency, wherein the difference of both these time distances then again enters into the measurement result of interest. The main difference from the time measurement method known from German Patent No. 30 12 186 is that only both the so-called fine measurement values, but not a coarse measurement value, are determined. The sum of the different delays, or "transit times", which both the repeatable individual signals are subjected to before the time measurement, is equal to the phase displacement to be measured. In that case, both these "transit times" are not generated thereby, that both the periodic signals have been generated simultaneously, i.e. without phase displacement, and then traversed paths of different length. Instead thereof, the different delays can have been imparted to both the periodic signals also from the start, i.e. already during their generation.

Beyond that, still further cases of application for the above named time measurement methods are feasible, which however all have in common that for two different types of pulse-like signals of short duration, the respective transit time has to be measured, whereby not the two transit times by themselves, but their difference is of interest. Furthermore the invention is only applicable in such cases, in which a signal of each type can be repeated several times whereby the respective transit time remains unchanged. For sake of simplicity in the following the signals of the first type are called "measuring pulse signals" since they can be used for example to travel along a distance of interest, whereas the signals of the second type are called "reference pulse signals" since they are mainly generated to establish a reference transit time which is to be subtracted from the transit time of the measuring pulse signals in order to eliminate measurement errors or in order to take into account a reference value. In any case, the transit time measurements for both types of signals comprise a so-called precision or fine time measurement in which the time distance of the respective pulse signal from a defined succeeding or preceding rising (or falling) edge of a rectangular time base signal or a succeeding or preceding defined zero transition of a sinusoidal time base signal, is to be measured and the differences of precision time measurement values for measuring pulse signals on the one hand and for reference pulse signals on the other hand are to be processed for the obtaining of a further measurement value. It is in that case presupposed that the difference between the time distances of the measuring pulse signals and the time distances of the reference pulse signals from the corresponding point of the time base signal remain unchanged during the repetitions of these individual signals because of the constancy of the respective transit times during these repetitions. The time distances are measured by one and the same time-to-amplitude converter circuit, wherein, when the measurement values to be subtracted one from the other are obtained sufficiently rapidly one behind the other, not only long term and medium term drift phenomena, but also short term fluctuations are eliminated because of the difference formation. It is in that case, however, required for the elimination of fluctuation and drift phenomena constantly to recalibrate the time-to-amplitude converter circuit with the aid of a standard of comparison. For this purpose the waveform period length of the time base signal is well suited when the time base signal is generated with the aid of a quartz-controlled oscillator. However, only individual points of the characteristic curve of the time-to-amplitude converter circuit can be determined by comparison with said time base signal, which points lie spaced one from the other by exactly one period length of the time base signal. The calibrated ranges of the charateristic curve disposed between these calibration points are of particular importance for the reason that the time distances to be measured for determining the transit times of the measuring and reference pulse signals usually are not an integral multiple of the period length of the time base signal. This means that the corresponding measurement values, i.e. the measured amplitudes of the output signal of the time-to-amplitude converter circuit normally lie somewhere between the amplitude values obtained at the calibration measurements. To obtain a time value from a measured amplitude value, therefore, the distance or distances between the spaced-apart calibration values have to be bridged over in the simplest case by a linear interpolation.

This causes a problem since the characteristic curve of the time-to-amplitude converter circuit can have such large non-linearities between the calibration points that impermissibly large errors can occur at least when a very high accuracy is demanded. The reason for these large errors is that the measurement values for the measuring pulse signals on the one hand and for the reference pulse signals on the other hand generally lies at different points of the characteristic curve of the time-to-amplitude converter circuit so that they contain error components caused by the non-linearity of the characteristic curve which are so different that they do not sufficiently cancel each other out when the one measurement value is subtracted from the other.

A possibility for the reduction of these errors consists in repeating the measuring pulse signals as well as the reference pulse signals so many times and completely uncorrelated with the time base signal that the error in the mean value resulting during a following mean value formation falls below the demanded limit of accuracy according to the root law of the error theory. In the case of very large non-linearities in the characteristic curve of the time-to-amplitude converter circuit or in the case of a very high demanded measurement accuracy, an extra-ordinarily large number of repetitions of the individual measuring and reference pulse signals can however be required for this, so that the time which is required for the obtaining of a correspondingly exact measurement and result, becomes very long. Particularly in the case of distance measurement methods, in which the distance of a very rapidly moving object shall be measured, such a long measurement time is not available, since the difference in the time distances of the individual measuring and reference pulse signals from the defined points of the time base signal must not change during this measurement time.

An objective of the invention is to provide a method of the foregoing kind that, in spite of the presence of unknown non-linearities in the characteristic curve of the time-to-amplitude converter circuit, results in measurement values of very high accuracy which can be obtained within a very short measurement time.

SUMMARY OF THE INVENTION

According to the invention, similarly as for the above-mentioned known statistical method, the intolerably large measurement errors, which appear in individual measurement values and are caused by the non-linearities in the characteristic curve of the time-to-amplitude converter circuit, are reduced in the required manner thereby, that several, namely n measurements are performed for said measurement pulse signals as well as for said reference pulse signals and mean values are formed from the measurement results. Other than in the case of the statistical error reduction, which after all only becomes effective when the time base signal is correlated in no manner with the individual signals so that measurement values result for each individual measurement, which are statistically distributed in their magnitude and thus also entailed by errors of different magnitude, a correlation in time between the generation of the individual signals and the time base signal is taken care of in the case of the method according to the invention. Without further measures, this would have the consequence that on each repetition of an individual measuring or reference pulse signal, the same time distance value would be measured, which would also be entailed by the same non-linearity error so that no increase in the measurement accuracy could yet result hereby. According to the invention to at least $n-1$ of n of said measuring pulse signals and to at least $n-1$ of n of said reference pulse signals an individual, additional predetermined time delay is imparted before the respective signal or a so-called time-significant signal which has a defined and unchangeable time relation thereto is used to start said time-to-amplitude converter circuit, the value of this additional delay being a different one for each of said $n-1$ measuring pulse signals and for each of said $n-1$ reference pulse signals. Consequently one obtains n different measurement values for said measuring pulse signals each of these n measurement values comprising a different non-linearity error. Through suitable choice of the individual $n-1$ delay values, care is taken according to the invention that said n measurement values are obtained for said measuring pulse signals, which values are distributed uniformly, i.e. about equidistantly over the entire calibrated range of the characteristic curve of the time-to-amplitude converter circuit so that all error contributions possible because of the non-linearity of the time-to-amplitude converter circuit characteristic curve are picked up about uniformly. Since the same also takes place for the n individual reference pulse signals, wherein each of the $n-1$ different delay values used for the measuring pulse signals comes into use a second time, the non-linearity errors are contained in like manner to a very good approximation in both the measurement value groups to be subtracted one from the other, so that they substantially are cancelled out by the subsequent subtraction and mean value formation. It is in that case completely immaterial whether one first forms the differences between two respectively associated measurement values, i.e. generated with the aid of the same delay value, of which one originates from a measuring pulse signal and the other from a reference pulse signal and then forms the mean value of these differences or whether first the mean values of the measurement values of all measuring pulse signals and of all reference pulse signals are formed and these mean values are then subtracted one from the other.

A substantial advantage of the method according to the invention compared with the above-mentioned statistical error reduction consists in that it manages with a appreciably lower number of repetitions of the individual signals and thus delivers very accurate measurement results substantially more rapidly. Thus, it has proved that it is for example possible with n=8 and a calibrated range of the characteristic curve of a length of 66.7 nanoseconds (corresponding to the period length of a time base signal of 15 MegaHertz) to depress the error caused by non-linearities in the calibrated range of the characteristic curve to less than $10^{-4}$ with a comparatively simple time-to-amplitude converter circuit, in which no particular effort in terms of circuit technique has been spent for the linearisation of the characteristic curve. If one performs the calibration of the characteristic curve of the time-to-amplitude converter circuit with the aid of a periodic signal, for example of the above mentioned time base signal, delivered by a quartz-controlled oscillator, then an accuracy of $10^{-11}$ and better lets itself be attained altogether, for which the measurement error becomes smaller than 10 picoseconds.

A particular advantage of the method according to the invention is to be seen in that it functions with the just described accuracy even when the characteristic curve of the time-to-amplitude converter circuit deviates in the calibrated region from the ideal linear course to only one side, i.e. systematically supplies only values which are either too large or too small.

For the avoidance of too frequent switch-over operations, the individual signals of the one signal group, for example the measuring pulse signals, can be generated first and thereafter the individual signals of the other signal group, for example the reference pulse signals, can be generated whereby at least n−1 signals of each group are subjected to the different additional delays. The prerequisite, which must be fulfilled for this, is that it is possible to generate both the signal groups within a period of time which is so small that the additional delays to which the individual signals are subjected cannot change to an extent which would deteriorate the measurement accuracy.

If the constancy of the additional delays cannot readily be maintained over a period of time required for the generation and measurement of two complete signal groups, then it is advantageous according to the invention alternately to generate always one signal of the one signal group and one signal of the other signal group and to subject these two successive signals to the same additional delay.

A further increase in the measurement accuracy can be obtained according to the invention by generating the individual signals of both the signal groups in such a manner that the time-to-amplitude converter circuit is operated periodically as exactly as possible. The characteristic curve of the time-to-amplitude converter circuit is then reproducible to a particularly good degree so that the errors respectively present in the individual measurements cancel out still better during the mean value and difference formation than this is the case for an aperiodic operation of the time-to-amplitude converter circuit. If calibration measurements are performed between the individual signal measurements, then also these calibration measurements are advantageously so controlled that a periodic operation of the time-to-amplitude converter circuit results over at least one signal group, which operation is then also performed at the same frequency for the other signal group.

A particularly simple design and a particularly simple control of the delay arrangement, serving for the generation of the different delay values, for the individual signals results when the n−1 chosen delay values each form an about integral multiple of a unit delay $\tau_0$; this can be obtained by providing in series connection n−1 delay stages each of which imparts to a signal passed therethrough the same delay $\tau_0$, and to pass each pulse signal through a different number of delay stages. It is advantageous that the delays, to which the n−1 signals of each signal group are subjected, are arranged in a rising or falling order so that for example the first of n signals is fed to the time-to-amplitude converter circuit undelayed, the second with a delay $\tau_0$, the third with a delay $2.\tau_0$ and so forth or in reverse sequence. Although it is advantageous that the delay values $\tau_0$ of each delay stage of the controllable delay arrangement are all equal to one another, this is not particularly critical. Deviations in the order of magnitude of ±30% are readily tolerable for the attainment of the above stated accuracy.

It has already been pointed out that it is expedient to calibrate the characteristic curve of the time-to-amplitude converter circuit with the aid of the period length of the time base signal which is adavantageously delivered by a quartz-controlled oscillator. For this purpose, two different types of calibration measurements are envisaged according to the invention, wherein the time-to-amplitude converter circuit is started in synchronism with the beginning of a waveform period of the time base signal, i.e. by an edge (or sine zero transition) of the time base signal and is stopped in synchronism with the beginning of a subsequent waveform period, i.e. by a succeeding edge (or sine zero transition) of the time base signal for each calibration measurement. Both the kinds of calibration measurements in that case differ in that the start and stop signals actually fed to the time-to-amplitude converter circuit are spaced differently far apart one from the other, for example three period lengths of the time base signal in the one kind of calibration measurements and four period lengths of the time base signal in the other kind of calibration measurements. Both the "end points" thus obtained define the calibrated range of the characteristic curve of the time-to-amplitude converter circuit. It is advantageous for the calibration measurements of the first kind, as this was stated above, to choose a time spacing, which differs from zero, between start and stop signal for the time-to-amplitude converter circuit and also for the actual time distance measurements, for which the time-to-amplitude converter circuit is started by the measuring pulse or reference pulse signal, not to use the immediately next, but only a correspondingly later rising (or falling) edge of the time base signal as stop signal, because interferences, which unavoidably arise during the switching-on of the time-to-amplitude converter circuit, in this way enter in like manner into all measurement results, and especially into the measurement results for measuring pulse and reference pulse signals which arise very shortly before the next rising (or falling) edge of the time base signal, and are thereby again completely eliminated because of the succeeding measurement value subtraction.

Preferably, only the fourth rising (or falling) edge of the time base signal, following on the starting of the time-to-amplitude converter circuit is employed as stop signal for the time-to-amplitude converter circuit. According to the invention to each measuring pulse or reference pulse signal a corresponding delay is imparted by the controllable delay arrangement before this pulse signal or a respective time-significant signal is fed not only to the time-to-amplitude converter circuit, but also to a counting circuit which performs the "counting" of the corresponding edges of the time base signal and passes on only the respective fourth edge as a stop signal to the time-to-amplitude converter circuit, this relation always remains maintained and the time-to-amplitude converter circuit operates for all time distance measurements for a period of time, the length of which corresponds to at least three and at most to somewhat more than four period lengths of the time base signal. Accordingly, also the calibrated range of the characteristic curve of the time-to-amplitude converter circuit is so chosen that its temporal length is equal to one period length of the time base signal and that it lies about between two points of the characteristic curve, which correspond to an operating time space of the time-to-amplitude converter circuit between three and four period lengths.

Preferably, the calibrated range of the characteristic curve is however slightly displaced in the direction of longer operating times relative to both these points. This is obtained with the aid of a delay member which is connected between the stop signal output of a second counting circuit, which is connected behind a start-stop control controlling both the kinds of calibration measurements, and the stop input of the time-to-amplitude converter circuit. The value of the delay delivered by this delay member is so dimensioned that it is equal to the response delay of the input stage of the first counting circuit. This has the purpose of applying each individual measuring or reference pulse signal or the respective time-significant signal simultaneously to the time-to-amplitude converter circuit and to the first counting circuit. While the time-to-amplitude converter circuit thereupon in each case immediately starts with the measurement operation, it can occur, when the respective pulse signal lies very closely in front of the next rising (or falling) edge of the time base signal, that the first counting circuit, due to the response delay of its input stage no longer detects this edge and thus releases only the fifth rising (or falling) edge of the time base signal as stop signal for the time-to-amplitude converter circuit. Since the time-to-amplitude converter circuit in these cases operates somewhat longer than four period lengths of the time base signal, without the above-mentioned displacement of the calibrated range towards the "rear", i.e. towards the longer times, the measurement value could here fall out of the calibrated range to the rear and thus impair the accuracy of the measurement end result.

In such cases, it is necessary according to the state of the art, i.e. in the case of a completely free-running time base signal, to perform a complete three-part time measurement for each of the individual signals, i.e. to measure with a time-to-amplitude converter circuit as a first precision measurement value the time distance, which a trigger signal causing the generation of the respective individual measuring pulse or reference pulse signal has from a defined edge of the time base signal, to measure likewise as a second precision measurement value by means of the same time-to-amplitude converter circuit, the time distance, which the respective individual measuring pulse or reference pulse signal has after termination of its transit time with respect to a defined edge of the time base signal, and as coarse measurement value to count the periods of the time base signal, which lie between both the just named edges. The transit time of an individual measuring pulse or reference pulse signal can then be calculated from these three measurement values so that four precision measurement value formations and two coarse measurement value formations are thus required according to the state of the art for the determination of the difference between the transit time of a measuring pulse signal and the transit time of a reference pulse signal.

Apart from the increased effort in terms of measurement technique, the significant disadvantage arises in that case that the time-to-amplitude converter circuit and the entire measuring channel can not be operated at a constant frequency because the transit times to be measured contain the measurement result of interest and are thereby variable. The two measurement operations which the time-to-amplitude converter circuit has to perform for one three-part time measurement generally have a time distance which is shorter than the time distance between one three-part time measurement and the next. This aperiodic operation of the measuring channel has however, as already mentioned, the consequence of an impairment in the accuracy of the measurement results thus obtained.

Because the trigger signal triggering the generation of each individual measuring pulse or reference pulse signal is in any case correlated rigidly in phase with the time base signal, the above-described respective first precision time measurement can be omitted. It suffices to determine only the coarse measurement values for at least one individual measuring pulse signal and for at least one individual reference pulse signal and to determine the precision time measurement values of all individual measuring and reference pulse signals in order to obtain from these measurement values the sought transit time difference with the accuracy, with which the period of the time base signal is constant and known. By omitting the "front" precision time measurement and by appropriately selecting the instants, in which the trigger signals are generated, it is possible to obtain the individual measuring and reference pulse signals at the input of the time measuring circuit in strict periodicity even when the individual measuring and reference pulse signals display very different transit times and are generated alternately.

It is to be pointed out that the time distance, which lies between the respective instant of generation of the at least one measuring pulse signal and the at least one reference pulse signal, for which a coarse measurement value is determined, and the succeeding (or preceding) edge of the time base signal, with which the period-counting is started, is without influence on the measurement result, since it can with certainty be regarded as constant within the short time space, within which these at least two signals can be generated, and thus cancels out on the succeeding difference formation.

If coarse measurement values are determined separately for each individual measuring and reference pulse signal, then it can occur, by reason of the systematical increase of the additional delay imparted to the individual signals, that one or more of these signals start the time-to-amplitude converter circuit at an instant which lies after the occurrence of that edge of the time base signal, which without imparting an additional delay would have followed as next on the individual signal concerned. The coarse measurement value then has a count value, which is higher by 1; this is again corrected by the difference formation with the associated correspondingly greater precision measurement value of the time-to-amplitude converter circuit.

In order not to load the output voltages of the time-to-amplitude converter circuit, which represent the individual precision time measurement values with incorrectable errors during the transfer to the following circuit unit, for example to a sample-and-hold circuit serving as analog intermediate store, this transfer is preferably so controlled that it is strictly synchronised with the time base signal. It has namely proved that the time base signal in a time measurement circuit of the kind coming into question here is present everywhere and thereby also on the line connecting the output of the time-to-amplitude converter circuit with the input of the sample-and-hold circuit, albeit as very small interference signal, yet impressing an appreciable error on the output voltage of the time-to-amplitude converter circuit. The amplitude of this interference signal is however exactly synchronised with the time base signal so that due to the synchronous control of the transfer of the analog measurement voltage from the time-to-amplitude converter circuit onto the sample-and-hold circuit, an always equally large error component results, which again drops out because of the subsequent subtraction of the measurement values.

BRIEF DESCRIPTION OF THE DRAWING

The invention is described in the following with the aid of an example of embodiment with reference to the drawing; in this, there show.

DESCRIPTION OF A PREFERRED EMBODIMENT OF THE INVENTION

Figure 1:
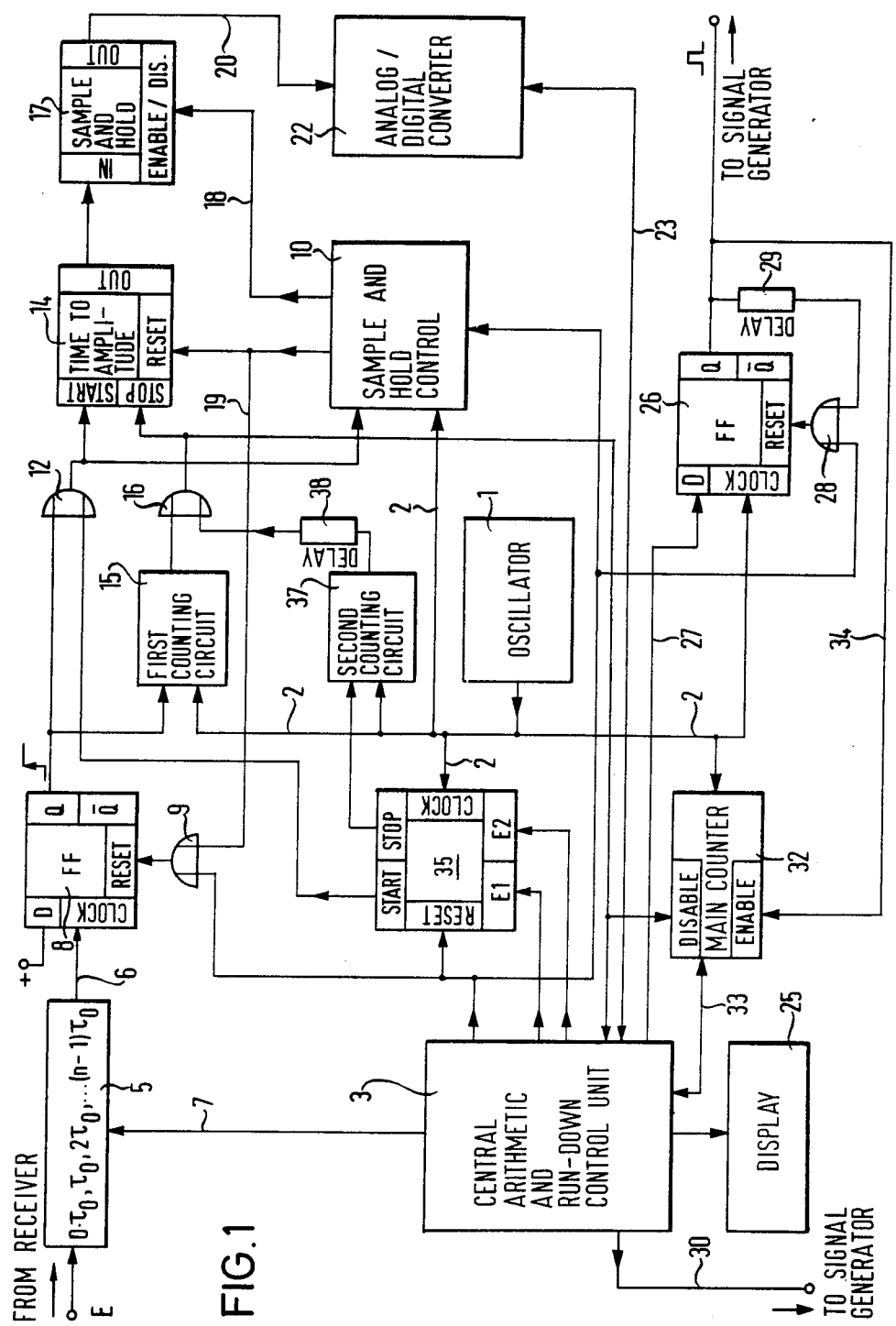
FIG. 1 a schematic overall illustration of a time measurement device according to the invention, FIG. 2 an example of embodiment for a controllable delay arrangement according to FIG. 1, FIG. 3 further details of circuit arrangements from FIG. 1, FIG. 4 an explanatory signal diagram and FIG. 5 an example of embodiment for an intermediate storage control according to the invention.

As shown in FIG. 1, a time measurement circuit according to the invention displays a quartz-controlled oscillator 1, which delivers a time base signal at a frequency of, for example, 15 MegaHertz. This time base signal is forwarded along a line 2 to all those circuit parts which shall in any manner generate or transmit signals synchronised with the time base signal. The entire circuit arrangement is controlled by a central arithmetic and run-down control unit 3 according to the requirements of the respective measurement task, within the framework of which the time measurement device comes into use.

As already mentioned, this measurement task can be the measurement of a distance between a measuring apparatus and a target as it is, for example, disclosed in German Openlaying Print No. 32 19 452. There the distance of a target is measured by determining the difference of the transit times of measuring light pulse signals and reference light pulse signals. For this purpose the known distance measuring apparatus comprises a trigger generator which, under the control of a central arithmetic and run-down control unit repeatedly generates trigger signals which are forwarded to a light pulse generator. In reaction on each of those trigger signals this generator emits an individual light pulse of very short duration and these light pulses are either used as measuring light pulses, which are transmitted along a measuring light path to the target and, after reflection therefrom, back to the measuring apparatus where they are received by an electro-optical receiver, or as reference light pulses, which are forwarded along a reference light path of known constant length inside said apparatus toward the same electro-optical receiver.

Said measuring light path establishes for the measuring light pulses an unknown time of travel being representative for the distance of the target, whereas the reference light path establishes for the reference light pulses a known constant time of travel. The electro-optical receiver generates on receipt of each measuring light pulse and of each reference light pulse a respective output signal, which is called a "time-significant" signal, since the moment of its generation is related in time to the moment at which the respective light pulse is received. In order to determine the times of travel of the measuring light pulses as well as of the reference light pulses a time measuring unit is provided which, for each light pulse, is started in synchronism with the respective trigger signal and is stopped by means of the corresponding time-significant signal. The time distances which are measured, do not only comprise the actual time of travel of the respective light pulse from the light emitting surface of the transmitter to the light receiving surface of the receiver, but also comprise the response times of the transmitter and of the receiver. Therefore, these measured time distances are called "signal transit times". By forming the differences of such signal transit times, i.e. by subtracting measurement values of reference signal transit times from measurement values of measuring signal transit times, the influence and changes of the response times of the transmitter and of the receiver can be eliminated and the times of travel of the measuring light pulses and therefrom the distance of the target can be obtained with very high accuracy.

The circuit arrangement shown in FIG. 1 can, for sake of an easier understanding, be considered to represent the arithmetic and run-down control unit, the trigger generator and the most important parts of the time measuring unit of such known distance measuring apparatus. As will be further explained below, flip-flop 26 is the simplest form of a trigger generator, which in response to respective command signals received on line 27 from arithmetic and run-down control unit 3, generates trigger signals which are synchronized with the time base signal supplied from oscillator 1. These trigger signals are forwarded to a generator or transmitter (not shown) which generates corresponding light pulse signals which, after having travelled through said measuring light path or through said reference light path are received by a receiver (also not shown) generating on the receipt of each light pulse an output signal which, in the present case, is not directly used as the above mentioned time-significant signal, but is fed according to the invention at input E to a controllable delay arrangement 5 on the output line 6 of which these individual signals appear after having been subjected to an additional predetermined delay the length of which can either be (almost) zero or have n−1 different values which are multiple integers of a basic delay $\tau_0$. The length of the additional delay which is imparted to any individual signal arriving at the input port of the controllable delay arrangement 5 is determined by a control signal, which the controllable delay arrangement 5 receives from the arithmetic and run-down control unit 3 via line 7.

The individual measuring pulse signals and reference pulse signals, the time spacings of which from a succeeding, defined rising edge of the time base signal shall be measured, are fed through the input E to the time measurement circuit according to FIG. 1. From there, they get directly to a controllable delay arrangement 5, on the output line 6 of which these individual signals appear, in dependence on a signal delivered by the arithmetic and run-down control unit 3 through the line 7 to the controllable delay arrangement 5, with a delay 0. $\tau_0$, i.e. undelayed, or with a delay which is an integral multiple of the unit delay $\tau_0$.

The output signals of the delay arrangement 5, which, in the following are supposed to be rectangular pulse signals, are used as trigger signals for a D-flip-flop 8 to the clock input of which they are forwarded on line 6. This flip-flop 8 can be reset by the output signal of an OR-gate 9 forwarding either a master resetting pulse delivered by the arithmetic and run-down unit 3 or a resetting pulse delivered from an intermediate storage control 10.

Flip-flop 8 is a D-flip-flop the data input of which constantly lies at a positive voltage, i.e. at a logic 1. Therefore, the Q-output of the previously reset flip-flop 8 is set from a logic 0 to logic 1 by the rising edge of each individual signal supplied on the line 6. The rising edge, which is generated in that case at the Q-output of D-flip-flop 8 gets on the one hand through an OR-gate 12 to the start input of a time-to-amplitude converter circuit 14, which thereupon starts with the measurement operation, and to a trigger input of the intermediate storage control 10 as well as on the other hand to the trigger input of a first counting circuit 15, which at its second input receives the time base signal through the line 2 and, after being triggered by the Q-output signal of the flip-flop 8 counts the rising edges of the time base signal and delivers in synchronism with the fourth counted edge an output signal via an OR-gate 16 to the stop input of the time-to-amplitude converter circuit 14, which hereby ceases its measurement operation and retains the attained output voltage until this has been taken over under the control of the intermediate storage control 10 into a sample-and-hold circuit 17 serving as analog intermediate store. For this purpose, the sample-and-hold circuit 17 is supplied by the control 10 through the line 18 with an appropriate control signal.

When this signal transfer is completed, then the intermediate storage control 10 through line 19 gives off a resetting signal, by which the time-to-amplitude converter circuit 14 and, as already mentioned above, the D-flip-flop 8 are reset into their respective initial state, in which they are ready for the processing of the next individual signal coming in through the input E.

The analog measurement result present at the output of the sample-and-hold circuit 17 gets through the line 20 to an analog-to-digital converter 22, which under the control of the arithmetic and run-down control unit 3 translates it into a digital form and gives this digital value off to the arithmetic and run-down control unit 3 for further processing through bidirectional line 23, on which it also receives its control commands. The arithmetic and run-down control unit 3 processes the measurement results thus received and the calibration measurement values obtained in similar manner in the required manner and calculates the measurement result actually of interest, which can be displayed by a display unit 25.

As mentioned above the D-flip-flop 26, which is represented in the right lower region of the FIG. 1 has a D-input to which a logic 1 is supplied at given instants as a command signal from the central arithmetic and run-down control unit 3 through a line 27.

This D-flip-flop 26 represents the simplest form of a synchronising circuit which, each time an appropriate command signal has been given off through the line 27 by the arithmetic and run-down control unit 3, to give off a trigger signal, having an exactly defined phase relation to the time base signal, for a generator which is not illustrated in the FIG. 1 and which thus generates in a strictly phase-rigid correlation with the time base signal the individual signals, which later, after having travelled through a measuring signal path or through a reference signal path appear at the input E. For this purpose, the time base signal of the oscillator 1 is supplied to the clock input of the D-flip-flop 26 through the appropriate part of line 2. This has the consequence that the D-flip-flop 26, which was previously reset through a OR-gate 28 either with the aid of the master resetting pulse generated by the arithmetic and run-down control unit 3 or with the aid of the trigger signal appearing at its own Q-output and delayed through the delay member 29 for the attainment of a certain minimum pulse width, is set through the first rising edge of the time base signal following on the command signal supplied through the line 27 so that the desired trigger signal for the signal generator appears at the Q-output of flip-flop 26 in synchronism with the time base signal.

The command signals, which are given off by the arithmetic and run-down control unit 3 for the generation of a respective synchronised trigger signal, are so generated that they have sufficiently large time distances. In response to these trigger signals the signal generator first generates n, i.e. for example eight individual signals of the first type, for example n measuring pulse signals, and then n, i.e. again eight individual signals of the second type, for example n reference pulse signals. The information whether it is supposed to generate signals of the first or of the second type, or whether pulse signals generated by the generator are to be used as signals of the first or as signals of the second type is supplied to the generator or to a subsequent selecting unit from the arithmetic and run-down control unit 3 along a line 30.

It is presupposed that each of the such generated measuring pulse signals, on the way from the signal generator to the input E needs a certain transit time, the magnitude of which is unknown but the same for each of the n measuring pulse signals. Correspondingly each of the so generated n reference pulse signals, on the way from the signal generator to the input E needs a certain transit time the magnitude of which is generally different from that of the measuring pulse signals.

Not only the time distances of the delayed individual measuring and reference pulse signals from a defined succeeding edge of the time base signal, but also substantially larger time distances, for example the whole time of travel of the individual measuring and reference pulse signals, are to be measured, then the corresponding measurement values can be obtained with the aid of a main counter 32, which receives the time base signal of the oscillator 1 through the line 2 and counts the relevant (i.e. either the rising or the falling) egdes-thereof. The counting start of the main counter 32 is initiated by the synchronisation flip-flop 26 through the line 34. The count result can be transferred from the main counter 32 through the bidirectional lines 33 into the arithmetic and rundown control unit 3. The counting operation of the main counter 32 for each individual measuring and reference pulse signal is terminated by the output signal of the OR-gate 16, which indeed also stops the time-to-amplitude converter circuit. Beyond that, this output signal of the OR-gate 16 is conducted to the arithmetic and run-down control unit 3, in order to indicate to this that the count result can now be taken over from the main counter 32 on the lines 33.

In order that the time-to-amplitude converter circuit 14 can always be calibrated again with the aid of the time base signal, a start-stop control 35 is provided, which can perform two different types of calibration measurement according to whether it receives a trigger signal at either its input E1 or its input E2 from the arithmetic and run-down control unit 3.

Being triggered at input E1, it delivers exactly simultaneously at its start output and at its stop output a respective signal, both signals being synchronised with the time base signal supplied through the line 2 to the pulse input of the start-stop control 35. The one of these two signals is fed through the OR-gate 12 to the start input of the time-to-amplitude converter circuit 14, which thereupon starts to operate, while the other is applied to the trigger input of a second counting circuit 37, which at its pulse input likewise receives the time base signal of the oscillator 1. This second counting circuit 37 thereupon counts the following relevant, for example the rising edges of the time base signal and provides in synchronism with the third of these edges a stop signal which is fed through a delay member 38 to the OR-gate 16, from where it gets as stop signal to the time-to-amplitude circuit 14, to counter 32 and to the arithmetic and run-down control unit 3. By reason of this triggering through the input E1 of the start-stop control 35, the time-to-amplitude converter circuit 14 thus operates for a space of time which is somewhat longer than three periods of the time base signal and thus delivers a first calibration measurement value suitable for the determination of a straight calibration line, since the period length of the time base signal delivered by the quartz-controlled oscillator 1 is after all known with very great accuracy and constant.

When the arithmetic and run-down control unit 3 applies a trigger signal to the input E2 of the start-stop control 35, then this again at both its outputs generates a start signal and a stop signal, respectively, which however this time are displaced one relative to the other in time by exactly one period length of the time base signal. They are fed in the same manner as described above to the time-to-amplitude converter circuit 14, which for this second kind of calibration measurement operates for a period of time, which is somewhat longer than four period lengths of the time base signal. Thereby, one then obtains a second, very exact calibration value which together with the previously described calibration value is suitable for the definition of a straight calibration line, with the aid of which the actual characteristic curve of the time-to-amplitude converter circuit can be approximated; the actual characteristic curve and the straight calibration line intersect each other in both the measurement points spanning the calibrated range of the characteristic curve.

Figure 2:
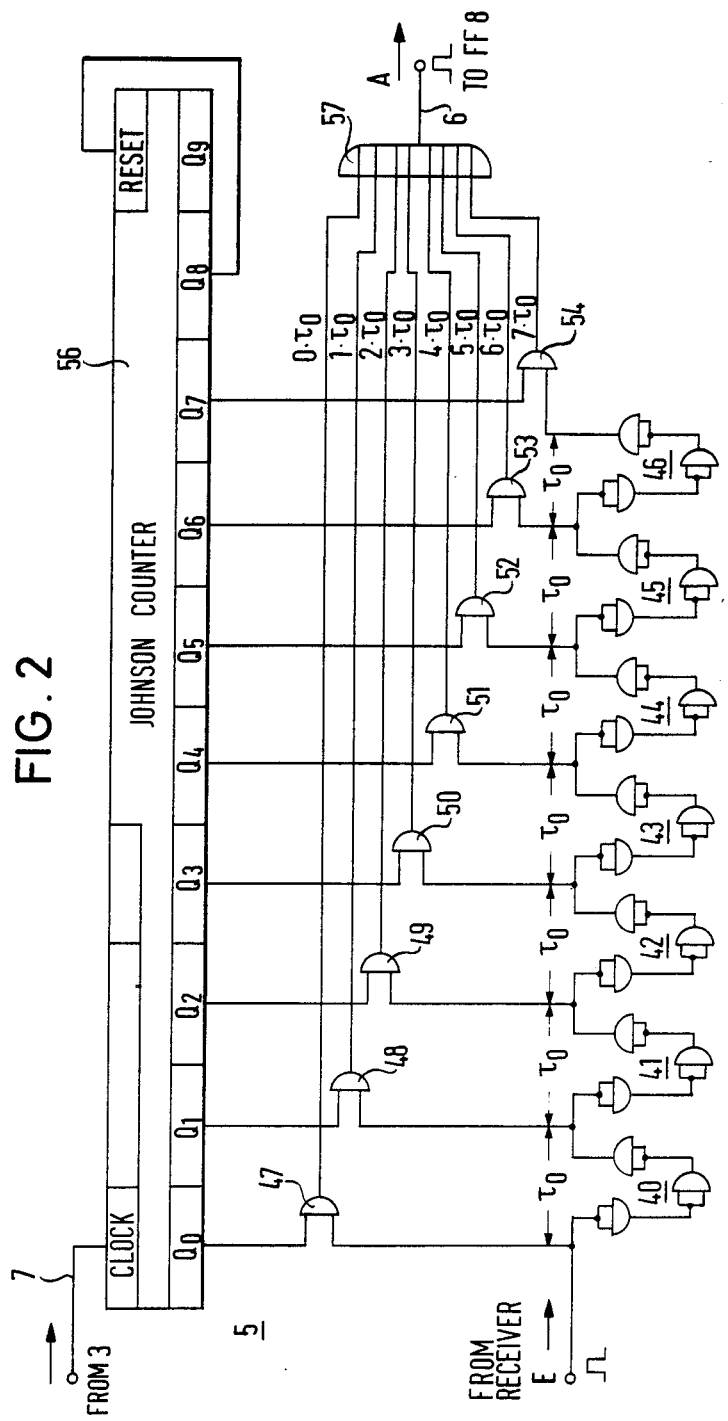

Because of the non-linearity of the actual characteristic curve of the time-to-amplitude converter circuit 14, appreciable deviations between the straight calibration line and the actual characteristic curve can however appear in the calibrated range. For the elimination of the errors possible hereby, a controllable delay arrangement 5, of which an example of embodiment is represented more exactly in FIG. 2, is used in the method according to the invention. As is evident from this Figure, the individual signals appearing at the input E are conducted to a chain of seven delay members 40 to 46, which are connected serially one behind the other and of which each consists of three AND-gates, which are connected serially one behind the other and both the inputs of which are short-circuited each to the other. Which kind and which number of delay elements is chosen for the formation of the delay members 40 to 46 is of subordinate significance. It is essential merely that each of the delay members 40 to 46 delivers about the same delay $\tau_0$, for which deviations of ±30% are however quite tolerable, and that the eightfold of this delay $\tau_0$ is equal to the temporal length of the calibrated range of the characteristic curve of the time-to-amplitude converter circuit 14, i.e. in the present case is thus about equal to one period length of the time base signal.

The controllable delay arrangement 5 furthermore comprises eight AND-gates 47 to 54, of which the first 47 is connected by its one input to the input of the first delay member 40, the second 48 to the input of the second delay member 41 and so forth, while the one input of the last AND-gate 54 is connected with the output of the last delay member 46. The respective second inputs of the AND-gates 47 to 54 are connected with the outputs $Q_0$ to $Q_7$ of a Johnson counter 56, which always gives off a logic 1 at only one of its Q-outputs, while all other Q-outputs lie at logic 0. The clock input of the Johnson counter 56 is connected through the line 7 with the central arithmetic and run-down control unit 3 so that the latter can determine through the delivery of a corresponding number of pulse signals which of the Q-outputs of the Johnson counter 56 applies a logic 1 to the associated AND-gate. It is thereby attained that only one of the AND-gates 47 to 54 is opened at any time, while all others are blocked.

When the AND-gate 47, for example, receives a logic 1from the output $Q_0$ of the Johnson counter 56, then an individual measuring or reference pulse signal, appearing at the input E, gets directly and practically undelayed through the output of this AND-gate 47 to the associated input of the OR-gate 57, which forms the common output member of the controllable delay arrangement and from where it is given off to the D-flip-flop 8. Simultaneously, this individual signal of course also passes through all delay members 40 to 46, but it can not get further from their outputs, since the remaining AND-gates 48 to 54 are blocked by the logic 0-levels, which in this switching state are given off by the outputs $Q_1$ to $Q_7$ of the Johnson counter 56.

If the above mentioned individual signal is, for example, a measuring pulse signal and if after termination of the respective transit time measurement the generation of an individual reference pulse signal is initiated by the central arithmetic and run-down control unit 3, then this individual reference pulse signal can with the same setting of the Johnson counter 56 run through the same signal path in the controllable delay arrangement 5 as the immediately preceding individual measuring pulse signal.

Before the next individual measuring pulse signal is then generated by reason of a trigger signal given off by the synchronising circuit 26 to the signal generator, the central arithmetic and run-down control unit 3 gives a clock pulse through the line 7 to the Johnson counter 56, which thereupon gives off a logic 1 at its $Q_1$-output, while all other Q-outputs lie at logic 0. If the individual measuring pulse signal then appears at the input E, then it can not get through the output of the now blocked AND-gate 47 to the OR-gate 57. Rather, it must run through the first delay member 40, whereupon it is conducted further by the now open AND-gate 48 to the OR-gate 57 and from there to the D-flip-flop 8. Thereby, this individual signal has thus been delayed by a time $\tau_0$ through the controllable delay arrangement 5.

The same then also applies to the second individual reference pulse signal.

Through appropriate further clocking of the Johnson counter 56, each succeeding pair of one measuring pulse signal and one reference pulse signal can then be subjected to a delay which each time is greater by $\tau_0$ than the delay of the preceding pair of individual signals. The delay value maximally attainable in this manner is $7.\tau_0$, which is reached when the Johnson counter displays a logic 1 at its output $Q_7$.

With the aid of this controllable delay arrangement, eight pairs of signals, each pair comprising one measuring pulse signal and one reference pulse signal can thus be generated whereby to the pulse signals of each pair the same delay is imparted, but each pair is subjected to a different delay. When the last of these pulse signals has run through, the Johnson counter 56 is clocked on by a further clock signal appearing on the line 7 so that at its output $Q_8$, there appears a logic 1, through which it sets itself back into its initial state, in which a logic 1 stands at disposal at the output $Q_0$.

Thereby, the Johnson counter 56 is ready for the next n pairs of measuring and reference pulse signals.

Figure 3:
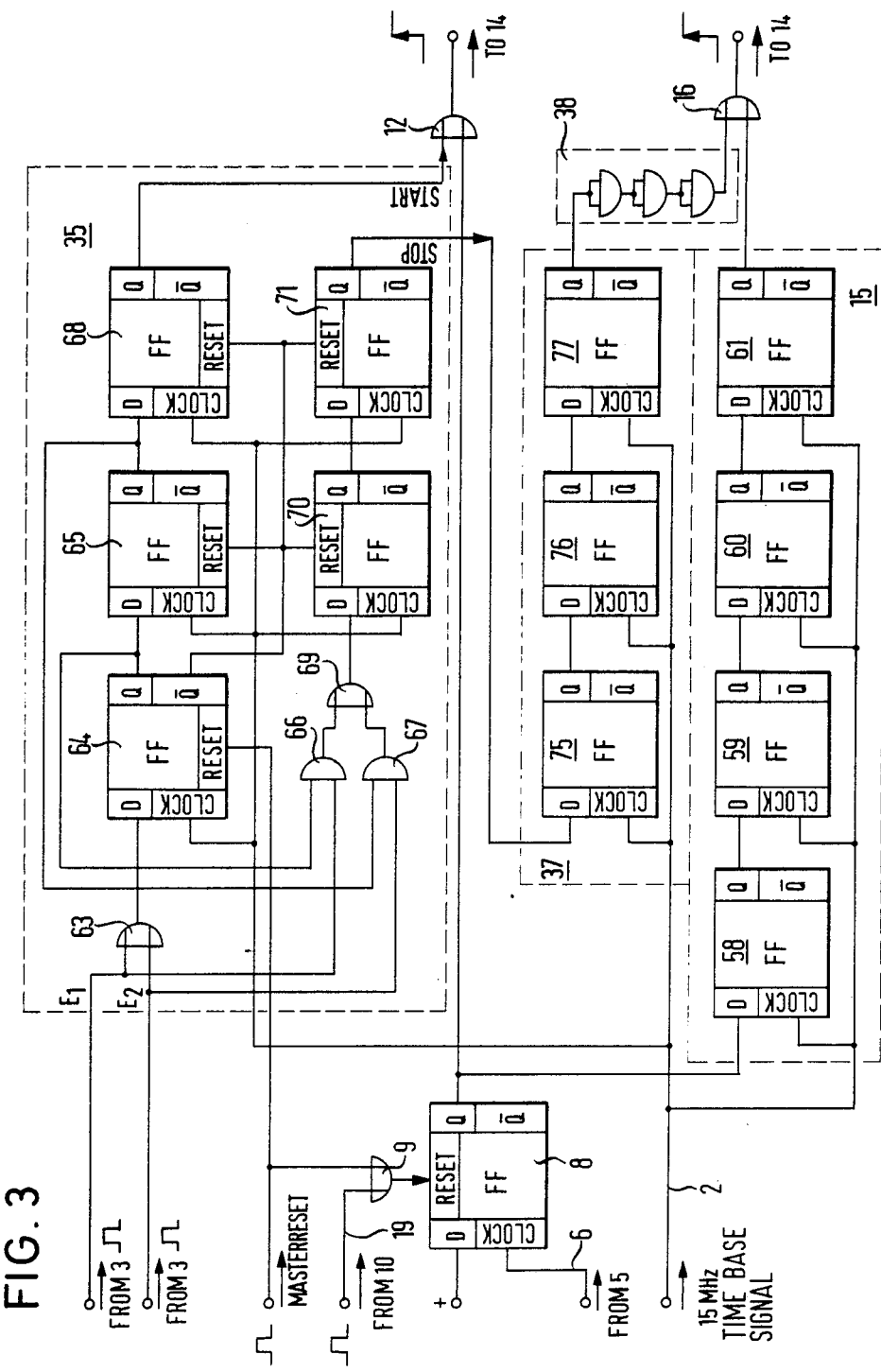

The first and the second counting circuits 15 and 37, the start-stop control 35 delivering the calibration start-stop signals and the delay member 38 connected behind the second counting circuit 37 are illustrated in greater detail in FIG. 3.

Reproduced quite at the left in FIG. 3 is the D-flip-flop 8, which on the line 6 receives the individual pulse signals after these have run through the controllable delay arrangement 5. When such an individual signal arrives at the clock input of the D-flip-flop 8, then this is set by the rising edge of the individual pulse signal, whereby at its Q-output, there appears a logic 1, which as already mentioned is passed on as a time-significant signal through the OR-gate 12 as start signal to the time-to-amplitude converter circuit. At the same time, this logic 1 is conducted to the data input of a D-flip-flop 58, which forms the input stage of a first counting circuit 15, which consists of a flip-flop chain comprising altogether four D-flip-flops 58 to 61, wherein the Q-output of each preceding flip-flop is connected with the D-input of a succeeding flip-flop. The pulse inputs of all these flip-flops 58 to 61 are supplied through the line 2 with the 15 MegaHertz time base signal. As long as the D-flip-flop 8 is reset, all flip-flops 58 to 61 of the chain show at their Q-outputs the logic 0 present in this state at the Q-output of the D-flip-flop 8; especially is a logic 0, present at the Q-output of the last flip-flop 61 of the chain and this logic 0 is supplied to the one input of the OR-gate 16. Since, in the normal case a logic 0 is also present at the other input of the OR-gate 16, also the output of this OR-gate lies at logic 0 at the time under consideration so that the time-to-amplitude converter circuit 14 receives no stop signal.

If the Q-output of the D-flip-flop 8 now switches to logic 1 by reason of the arrival of an individual measuring or reference pulse signal, then this logic 1 is shifted through the flip-flop chain 58 to 61 by the next four rising edges of the time base signal, i.e. it appears simultaneously with the fourth rising edge at the Q-output of the flip-flop 61 and gets through the OR-gate 16 as stop signal to the time-to-amplitude converter circuit 14.

However, the D-flip-flop 58 forming the input stage of this first counting circuit 15 possesses a certain response delay, i.e. a certain minimum time space must elapse between the application of the logic 1 to the D-input of this flip-flop and the appearance of the next rising edge of the time base signal in order that the logic 1 is actually taken over through this edge to the Q-output. The individual measuring and reference signals setting the D-flip-flop 8 are so generated that they possess a fixed time correlation with the time base signal. However, between their generation and their arrival at the D-flip-flop 8 a respective transit time of unknown magnitude elapses which is to be measured by the time measurement method according to the invention. This unknown transit time can readily have such a value that either the pulse signal passing undelayed through the delay arrangement 5 or one of the additionally delayed individual pulse signals triggers the D-flip-flop 8 so shortly before the appearance of the next rising edge of the time base signal that the flip-flop 58 by reason of its response delay described above does not react to this rising edge so that the flip-flop 61 gives off a stop signal to the time-to-amplitude converter circuit 14 only on the appearance of the fifth signal edge. In this case, the time-to-amplitude converter circuit then operates somewhat longer than four periods of the time base signal.

Reproduced in detail in the upper region of the FIG. 3 is the start-stop control 35, which receives a trigger signal either at its input E1 or at its input E2 from the central arithmetic and run-down control unit 3 and thereupon causes either a calibration measurement of the first type or a calibration measurement of the second type.

As long as a trigger signal is present at none of both the inputs E1 and E2, i.e. both these inputs are thus kept at logic 0, an OR-gate 63 connected with both these inputs also at its output gives off a logic 0, which is conducted to the D-input of a flip-flop 64. Since the clock input of this flip-flop 64 is connected with the time base signal, this logic 0 for this status of the inputs E1 and E2 is also maintained at the Q-output of the flip-flop 64, from where it is applied on the one hand to the data input of a further flip-flop 65 as well as to the one input of an AND-gate 66. The $\overline{Q}$-output, lying at the same time at logic 1, of the flip-flop 64 is connected with the resetting input of the flip-flop 65, which is held by this logic level in its reset state so that at its Q-output, there likewise appears a logic 0, which is conducted to the one input of a further AND-gate 67 and the D-input of a third flip-flop 68, the resetting input of which is likewise connected with the $\overline{Q}$-output of the flip-flop 64 so that the Q-output of the flip-flop 68, which also is the start output of the start-stop control 35, displays a logic 0, which is conducted to the second input of the OR-gate 12. Due to the fact that both the AND-gates 66 and 67 in this state, in which no trigger signal is yet applied to the inputs E1 or E2, each receive a logic 0 at both inputs, they also give off a logic 0 at their respective outputs so that the OR-gate 69 connected behind them at its output likewise shows a logic 0, which is conducted to the D-input of a fourth flip-flop 70, the resetting input of which is likewise connected with the $\overline{Q}$-output of the flip-flop 64 so that the flip-flop 70 is held in its reset state in that at its Q-output appears a logic 0, which is passed on to the D-input of a fifth flip-flop 71, the resetting input of which is likewise connected with the $\overline{Q}$-output of the flip-flop 64 so that also this flip-flop 71 is reset. The Q-output of the flip-flop 71, which in this stage lies at logic 0, is the stop output of the start-stop control 35. The pulse inputs of the flip-flops 65, 68, 70 and 71 are also connected with the line 2 supplying the time base signal.

When a positive going trigger signal is now applied to the input E1 of the start-stop control 35 by the central arithmetic and run-down control unit 3 for the performance of a calibration process of the first type, then the resulting logic 1-level gets on the one hand through the OR-gate 63 to the D-input of the flip-flop 64 and on the other hand to one of both the inputs of the AND-gate 66. This logic 1-level is maintained for a longer space of time through the central arithmetic and run-down control unit 3. Thereby, the logic 1 present at the data input of the flip-flop 64 can first be transferred to the Q-output through the first rising edge of the time base signal following the application of the trigger signal. From there, it gets on the one hand to the data input of the flip-flop 65 and on the other hand through the AND-gate 66, now displaying a logic 1 at both its inputs, and the OR-gate 69 to the data input of the flip-flop 70.

Since simultaneously with the appearance of a logic 1-level at the Q-output of the flip-flop 64, the $\overline{Q}$-output of this flip-flop decays to logic 0, the resetting inputs of the flip-flops 65, 68, 70 and 71 connected with this output are released so that these flip-flops can subsequently react to the signals at their data and pulse inputs.

Since a logic 1 is present at the data input of the flip-flop 65 as well as at the data input of the flip-flop 70 when the flip-flop 64 is set, both these flip-flops are set simultaneously by the next succeeding rising edge of the time base signal so that a logic 1 appears at their Q-outputs and is applied to the data inputs of both the succeeding flip-flops 68 and 71, respectively. The logic 1 present at the Q-output of the flip-flop 65 beyond this gets to the one input of the AND-gate 67, which is blocked through its other input lying at logic 0. Then, also both the flip-flops 68 and 71 are set simultaneously through the third rising edge of the time base signal following upon the application of the trigger signal so that at their Q-outputs, which are indentical with the start output and stop output respectively of the start-stop control 35, there appear two rising edges at the same time, of which the one gets through the OR-gate 12 as start signal to the time-to-amplitude converter circuit 14, while the logic 1-level appearing at the stop output of the start-stop control 35 is applied to the input of a second counting circuit 37, which is built up similarly to the first counting circuit 15 out of a chain of D-flip-flops 75, 76 and 77, in which always the one Q-output of a preceding flip-flop is connected to the D-input of a succeeding flip-flop and in which all clock inputs are connected with the line 2 supplying the time base signal. Since this second counting circuit comprises only three flip-flops, the Q-output of the last flip-flop 77 of this chain is set to logic 1 by the third rising edge of the time base signal occurring after the simultaneous appearance of the start signal and the stop signal at the concerned outputs of the start-stop control 35. This third rising edge is delayed by the delay member 38, which is connected to the output of the second counting circuit 37 and which, in the present case, consists of three gates connected in series, each of these gates having its inputs connected to one another; the delay which is established by this delay member 38 is equal to the response time of the input flip-flop 58 of the first counting circuit 15. After being subjected to this constant delay the third rising edge is then conducted as stop signal through the OR-gate 16 to the time-to-amplitude converter circuit 14. Thereby, the time-to-amplitude converter circuit 14 thus operates during this calibration operation of the first type for a period of time which is longer than three period lengths of the time base signal by the slight delay of the delay member 38.

When this calibration measurement of the first type is terminated the arithmetic and run-down control unit 3 generates a master resetting signal, through which the flip-flop 64 is again reset. Since no logic 1 any longer appears at the input E1, the flip-flop 64 remains reset. Through the logic 1 occurring at its $\overline{Q}$-output on resetting, the remaining flip-flops 65, 68, 70 and 71 are also constrainedly reset insofar as this has not already occurred through a shifting-on of logic 0-levels. The start output and the stop output of the start-stop control 35 thereby again lie at logic 0.

If a calibration measurement of the second type is to be performed, the arithmetic and run-down control unit 3 delivers a corresponding trigger signal to the input E2. The operations devolving thereupon in dependence on the rising edges of the time base signal correspond largely to the operations described above for the calibration measurement of the first type. The only difference consists in that the data input of the flip-flop 70 does not receive its logic 1 simultaneously with the data input of the flip-flop 65, but only simultaneously with the data input of the flip-flop 68, since the AND-gate 66 is blocked in the present case through the input E1 and the AND-gate 67, which is opened through the input E2, is connected by its second input with the Q-output of the flip-flop 65. In the final effect, this has the consequence that the start signal for the time-to-amplitude converter circuit 14 appears at the Q-output of the flip-flop 68 earlier by one period length of the time base signal than the stop signal at the Q-output of the flip-flop 71.

Since this stop signal is then likewise delayed by three period lengths by the second counting circuit 37 and further delayed through the delay member 38 in the same manner as the stop signal during the calibration measurement of the first type, the time-to-amplitude converter circuit in this case operates for a period of time which is somewhat larger than four period lengths of the time base signal.

Since, as already explained, the time-to-amplitude converter circuit during the performance of the time distance measurements for the individual measuring or reference pulse signals likewise operates for a period of time, which is at least equal to three and at most equal to somewhat more than four period lengths of the time base signal, it is thus made certain that the measurement values obtained in that case always fall into the calibrated range of the characteristic curve of the time-to-amplitude converter circuit lying between both the calibration measurement points.

Before this is explained in more detail by reference to the FIG. 4, it is still to be pointed out that it is advantageous to include each time distance measurement for an individual measuring or reference pulse signal between two calibration measurements, of which the one can be of the first type and the other of the second type. It is in this case advantageous to control the generation of the individual measuring or reference pulse signals on the one hand and the triggering of the calibration measurements on the other hand by the central arithmetic and run-down control unit 3 so that the time-to-amplitude converter circuit is operated periodically as far as possible.

Figure 4:
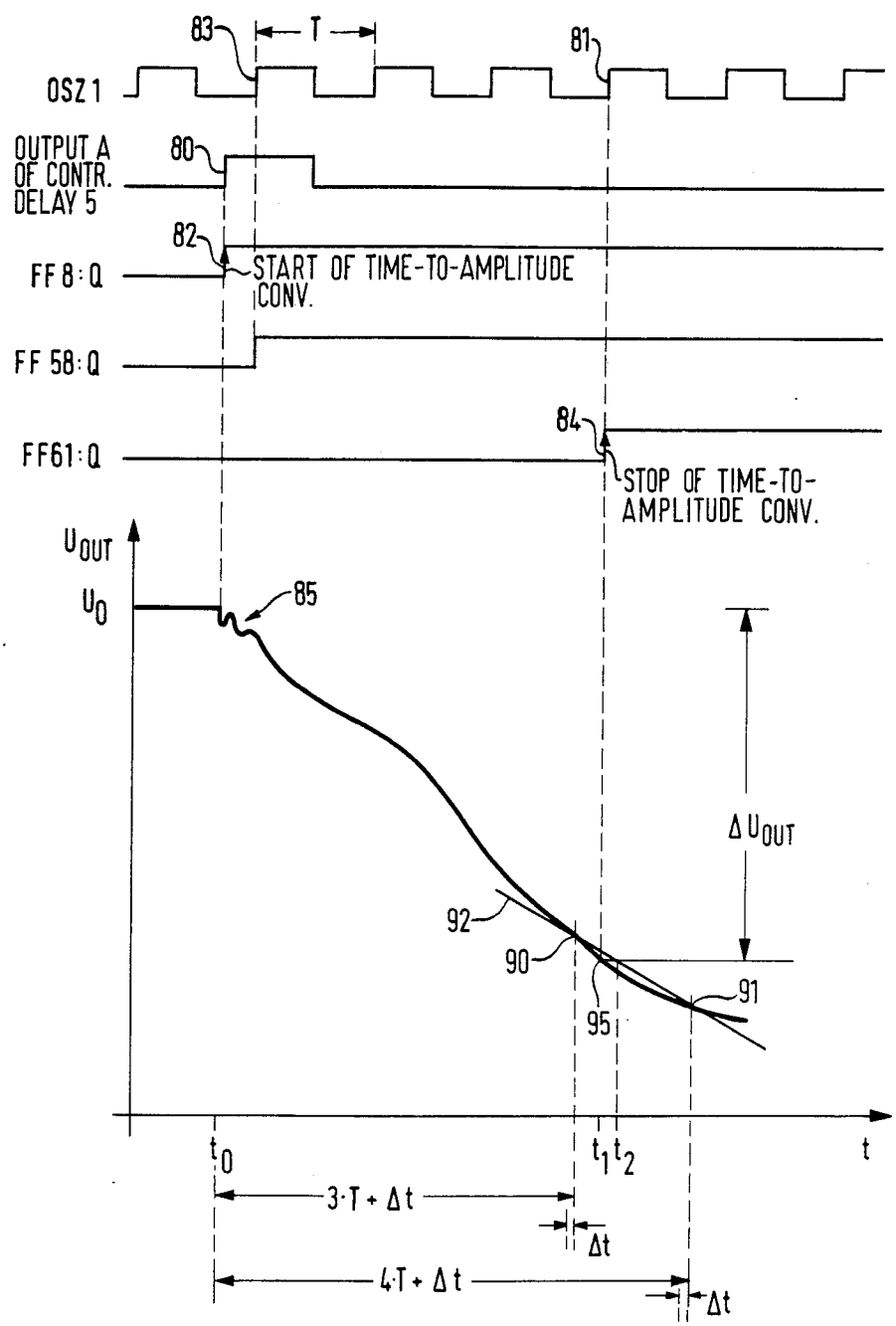

Represented as rectangular signal in the uppermost line in FIG. 4 is the time base signal, which is generated by the oscillator 1 and the period length of which is designated by T. A time-significant signal which, in reaction on the receipt of an individual measuring or reference pulse signal appearing at the input E appears after the respective additional delay on line 6 is represented in the line lying therebelow, whereby not the entire pulse represented in this second line, but only the rising edge 80 thereof represents this time-significant signal, the time distance of which from a defined succeeding edge, in the present case from the edge 81 of the time base signal, shall be measured.

The flip-flop 8 is set by the edge 80 so that the Q-output thereof, as represented in the third line from the top of the FIG. 4, steps to a logic 1-level. The rising edge 82 occurring in that case starts the time-to-amplitude converter circuit through the OR-gate 12, while the logic 1-level following the edge 82 prepares the first counting circuit 15 for a counting of the succeeding rising edges of the time base signal. This is indicated in the fourth line from the top of the FIG. 4 by the Q-output signal of the flip-flop 58, which on the occurrence of the first rising edge 83 of the time base signal following the signal edge 80 goes to logic 1. This logic 1 is then shifted on by the flip-flop chain 59, 60 and 61 by each rising edge of the time base signal so that the Q-output of the last flip-flop 61 of this chain goes to logic 1 on the occurrence of the fourth edge 81 of the time base signal. The rising edge 84 occurring in that case is fed as stop signal through the OR-gate 16 to the time-to-amplitude converter circuit.

A typical characteristic curve of a time-to-amplitude converter circuit 14 is illustrated below these pulse diagrams. Such a circuit consists essentially of a charging capacitor which is discharged through a switch lying parallel therewith and closed in the rest state so that both the capacitor plates in the rest state lie at the same voltage namely at the supply voltage $U_0$ of the time-to-amplitude converter circuit 14. Lying in series with this charging capacitor is a constant current source which is switchable on and again off and which consists of a sufficiently rapidly switchable GigaHertz transistor and an emitter resistor designed in accordance with the desired magnitude of the current impression. Thus connected one with the other in sequence are supply voltage $U_0$ with the one charging capacitor plate, the other charging capacitor plate with the collector of the current source transistor, the emitter of the current source transistor with the emitter resistor and the emitter resistor with the signal ground. This constant current source is switched on through the base of the current source transistor by means of a usual logic signal generated in the time-to-amplitude converter circuit 14 in response to the start signal coming from the OR-gate 12 and again switched off by the stop signal coming from the OR-gate 16. On the switching-on of the constant current source and simultaneous opening of the discharge switch lying in parallel with the charging capacitor, the voltage at the charging capacitor rises substantially linearly, which has the consequence of a likewise linear falling of the collector potential or of the corresponding charging capacitor plate potential. In the rest state, the constant current source is switched off and the discharge switch is closed.

If one uses the above described constant current source, which is switchable on and off, as charging circuit in the time-to-amplitude converter circuit 14, then a more or less linear rise of the absolute value of the voltage $\Delta U_{out}$ present at the charging capacitor occurs after a start of the time-to-amplitude converter circuit 14 after some unavoidable initial disturbances which are characterised by the reference symbol 85 in FIG. 4. The calibrated range of the characteristic curve is defined by the points 90 and 91 in the FIG. 4. The first calibration point 90, obtained through a calibration measurement of the first type, has a spacing of $3.T + \Delta t$ from the switch-on instant $t_0$ of the time-to-amplitude converter circuit 14, wherein $\Delta t$ signifies the delay introduced by the delay member 38. The second calibration point 91, obtained through a calibration measurement of the second type, thereagainst possesses a spacing of $4.T + \Delta t$ from the instant $t_0$. A straight interpolation line 92 is drawn between both these calibration points 90 and 91 and one sees clearly that the actual characteristic curve deviates appreciably from the ideal curve of the straight interpolation line 92 by reason of non-linearities.

In the case of the time spacing measurement illustrated in FIG. 4, the course of the output voltage $U_{out}$ of the time-to-amplitude converter circuit no longer follows the illustrated characteristic curve after the point 95 co-inciding with the edge 84, but bends over horizontally, since the constant current source in the time-to-amplitude converter circuit 14 is switched off by the stop signal 84 and the charging capacitor thereby retains the value of the output voltage $\Delta U_{out}$ which is attained at this instant until this output signal value has been taken over into the sample-and-hold circuit 17 connected therebehind. One sees very clearly that, on a calculation of the period of time elapsed between the switch-on instant $t_0$ and the switch-off instant $t_1$ from the measurement value $\Delta U_{out}$ and the slope of the straight interpolation line 92, a value $t_2$ involving an appreciable error is obtained because of the non-linearity of the actually effective characteristic curve of the time-to-amplitude converter circuit 14.

If one now performs the same time distance measurement for another individual measuring or reference pulse signal, the time distance of which shall be subtracted from the time distance of the individual measuring or reference pulse signal reproduced in FIG. 4, then the associated switch-off edge 84' will generally lie at another point on the calibrated range of the characteristic curve, at which also another error t2'−t1' results, so that the errors t2−t1 and t2'−t1' do not mutually cancel out to an adequate extent during the subsequent subtraction of both these time measurement values. Through the method according to the invention, thereagainst, through the n-fold repetition of the respective individual measuring and reference pulse signals and the displacement of the switch-off edge 84, then undertaken with the aid of the different additional delays of the individual measurement and reference pulse signals, over the entire calibrated range of the characteristic curve, care is taken that all errors possible by reason of the non-linearity enter to about the same extent into the mean value of said n measuring pulse signals as well as into the mean value of said n reference pulse signals. Since the second of these mean values is subsequently subtracted from the first one, these error sums mutually cancel out each other completely or almost completely.

In order not to falsify the output signals obtained at the output of the time-to-amplitude converter circuit 14 during the individual time distance measurements and calibration measurements in very different manner with an interference signal originating from the time base signal, the transfer of these output voltages into the sample-and-hold circuit 17 connected behind the time-to-amplitude converter circuit 14 is controlled exactly synchronously with the time base signal. The intermediate storage control 10 illustrated in detail in FIG. 5 serves for this.

Figure 5:
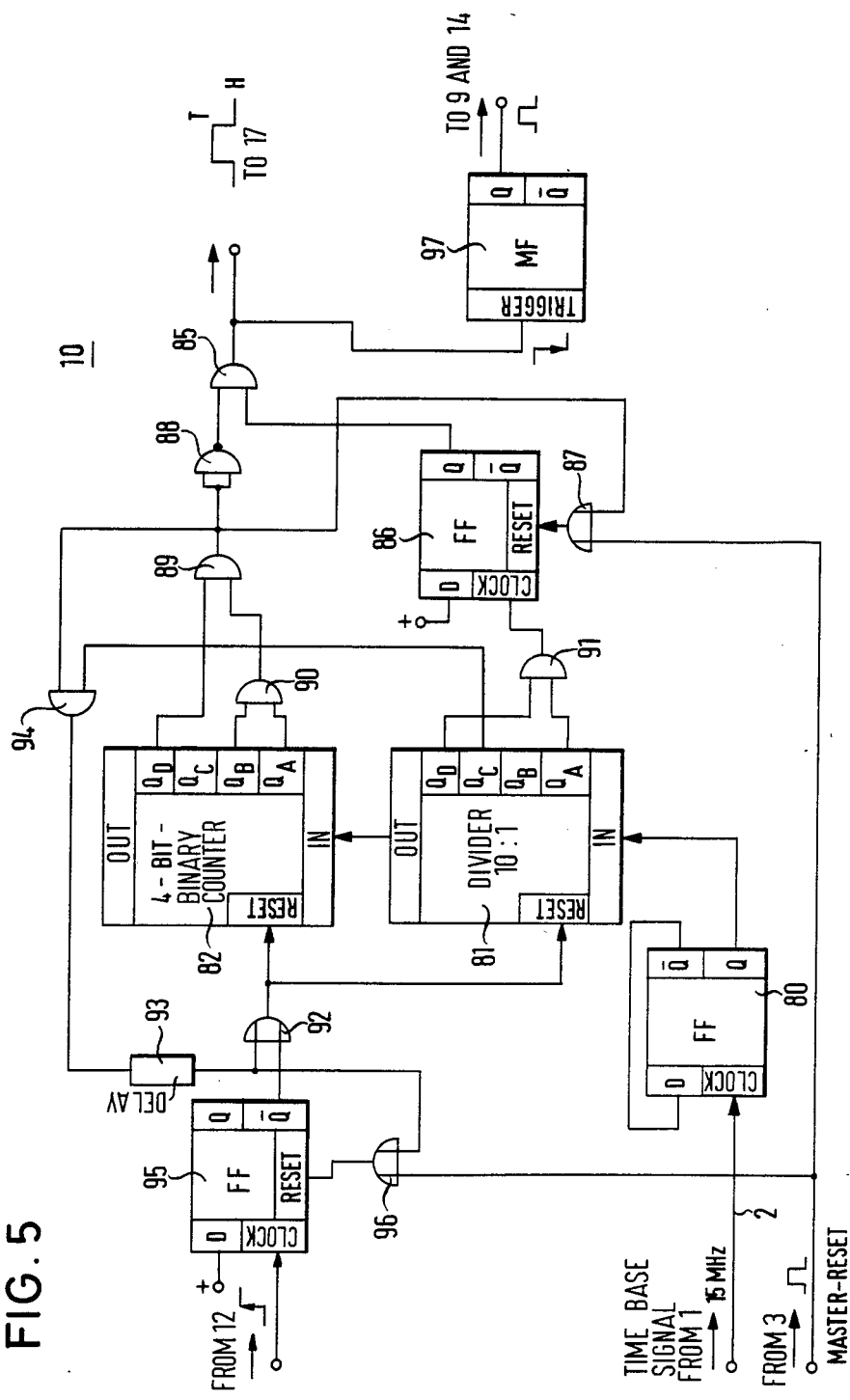

As is evident from the FIG. 5, a preferred intermediate storage control 10 comprises a frequency divider arrangement which consists of a flip-flop 80, a 10:1 divider 81 connected at its counting input with the Q-output of the flip-flop 80 and a 4-bit binary counter 82 connected by its counting input with the counting output of the 10:1 divider 81, while the 15 MegaHertz time base signal of the oscillator 1 is supplied to the clock input of the flip-flop 80. The $\overline{Q}$-output of this flip-flop 80 is connected with the D-input of this flip-flop so that the flip-flop 80 at its Q-output permanently gives off rectangular signals with a repetition frequency of 7.5 MegaHertz.

The output signals of the frequency divider arrangement are decoded with the aid of AND-gates in order to generate at suitable times a track-hold signal of suitable length for the sample-and-hold circuit 17, as is explained in the following.

As long as no output signal of the time-to-amplitude converter circuit 14 is to be taken over into the sample-and-hold circuit 17, a "Hold" signal, i.e. a logic zero in the present case, must lie at the control input of the sample-and-hold circuit 17. This logic zero in the rest state of the intermediate storage control 10 is given off by an AND-gate 85, the one input of which is supplied with a logic zero from the Q-output of a flip-flop 86, since the flip-flop 86 has been reset through the OR-gate 87 either by a preceding master resetting pulse given off by the central arithmetic and run-down control unit 3 or by a resetting pulse generated by the intermediate storage control 10 itself. The other input of the AND-gate 85 is connected with the output of an invertor 88, which in the case of the rest state under consideration delivers a logic one, since the AND-gate 89 driving the input of the invertor 88 receives a logic zero at both its inputs and thus gives off a logic zero at its output.

The one input of the AND-gate 89 is connected with the $Q_D$-output of the 4-bit binary counter 82, while the other input of the AND-gate 89 is connected with the output of a further AND-gate 90, the inputs of which are connected with the $Q_B$-output and the $Q_A$-output of the 4-bit binary counter 82. Since this counter 82 in the rest state under consideration is held through its reset input in the reset state, its outputs $Q_A$ to $Q_D$ each display a logic zero, which through the AND-gates 90 and 89 leads to the above described driving state for the invertor 88.

The 10:1 divider 81, too, is constrainedly held in the reset state through its reset input in the rest state of the intermediate storage control 10 so that a logic zero is present also at each of its outputs $Q_A$ to $Q_D$. The outputs $Q_A$ and $Q_D$ of the 10:1 divider 81 are connected with both the inputs of an AND-gate 91, the output of which is connected with the pulse input of the flip-flop 86. Since a logic zero is fed to both the inputs of the AND-gate 91 in the time space under consideration, its output also lies at a logic zero so that no driving of the flip-flop 86 takes place.

The 1-level holding the 10:1 divider 81 and the 4-bit binary counter 82 in the reset state is delivered by an OR-gate 92, the one input of which is connected through a delay member 93 with the output of an AND-gate 94, which delivers a logic zero, because its one input is connected with the $Q_C$-output, delivering a logic zero, of the 10:1 divider 81 and its other output is connected with the output of the AND-gate 89 likewise delivering a logic zero.

The second input of the OR-gate 92 is connected with the $\overline{Q}$-output of a flip-flop 95, which has been reset through an OR-gate 96 driving its resetting input either with the aid of a preceding master resetting pulse or through a resetting pulse generated by the intermediate storage control 10 itself so that its Q-output delivers the logic 1, which is passed on by the OR-gate 92 to the resetting inputs of the 10:1 divider 81 and of the 4-bit binary counter 82.

The clock input of the flip-flop 95 is connected with the output of the OR-gate 12, which is also connected with the start input of the time-to-amplitude converter circuit 14.

When the OR-gate 12 now delivers a rising edge serving as start signal for the time-to-amplitude converter circuit 14, then also the flip-flop 95 is set by this rising edge, since the D-input thereof lies constantly at logic 1. This setting of the flip-flop 95 effects a start of the intermediate storage control 10, since a new measurement value, which must be taken over into the sample-and-hold circuit 17, is to be expected after a certain time at the output of the time-to-amplitude converter circuit 14 after the starting thereof.

A period of time which is a little larger than the time which the time-to-amplitude converter circuit needs to obtain a measurement value is generated with the aid of the frequency divider arrangement 80, 81 and 82, which is initiated thereby, that the resetting inputs of the 10:1 divider 81 and of the 4-bit binary counter 82 are released by the application of a logic 0. This logic 0 arises thereby, that the Q-output of the flip-flop 95 switches to logic 0 on the resetting thereof and thus a logic 0 is present at both inputs of the OR-gate 92.

Through the release of its resetting input, the 10:1 divider 81 is put in a position to react to the 7.5 MegaHertz pulses given off by the flip-flop 80 and present at its counting input. After it has received nine such pulses, i.e. after 18 periods of the time base signal and thus at an instant, in which the time-to-amplitude converter circuit 14 has with certainty completed its measurement operation and in which also interferences, which have possibly occurred at its output by reason of the stop signal fed to it, a logic 1 appears simultaneously at the $Q_A$-output and at the $Q_D$-output of the 10:1 divider 81 so that also the AND-gate 91 switches at its output from logic 0 to logic 1. The positive edge occurring in that case sets the flip-flop 86, the D-input of which lies constantly at logic 1. Thereby, at the Q-output of the flip-flop 86, there appears a logic 1, which is given off through the AND-gate 85, at the other input of which is present the logic 1 given off by the invertor 85, to the control input of the sample-and-hold circuit 17 as "track" signal so that this starts to take over the measurement value present at the output of the time-to-amplitude converter circuit 14. For this take-over, which occurs essentially thereby, that a capacitor contained in the sample-and-hold circuit 17 is charged through a finite resistor to the same voltage as is present at the output of the time-to-amplitude converter circuit 14, a certain minimum period of time is necessary, which is determined by the time constant of the charging capacitor under discussion and the associated charging resistor. This time constant cannot be chosen to have an arbitrarily small magnitude, since the analog voltage value intermediately stored by this charging capacitor must be available unchanged for a predetermined minimum period of time for the following analog-to-digital conversion. Since every capacitor displays a leakage current, which changes its state of charge and thereby the voltage decaying across it and which leakage current is however largely independent of the capacitance of the capacitor, a capacitor of a sufficiently large capacitance must thus be chosen in the present case.

A track signal of adequate length is generated thereby, that the 4-bit binary counter 82 generates a logic 1 simultaneously at its $Q_A$-output, $Q_B$-output and $Q_D$-output only on the eleventh output pulse of the 10:1 counter 81, i.e. only after 220 periods of the 15 MegaHertz time base signal, which logic 1 is passed on through the AND-gates 90 and 89 to the input of the invertor 88, which thereupon applies a logic 0 to the corresponding input of the AND-gate 85 so that the control signal, appearing at the output of the AND-gate 85, for the sample-and-hold circuit 17 decays to the "hold" level. The instant of this falling edge, which fixes the voltage value taken over from the sample-and-hold circuit and intermediately stored for the succeeding digitalisation, is correlated through the frequency divider arrangement 80, 81 and 82 and the AND-gates 90 and 89, the invertor 88 and and the AND-gate 85 with the 15 MegaHertz time base signal. Although a certain temporal delay occurs between the named falling edge and the associated rising edge of the 15 MegaHertz time base signal, this delay can yet be regarded as constant to a very good approximation at least in the short space of time which is required in order to obtain the measurement values, which are to be subtracted one from the other, of two individual signal groups. It is attained through this temporal synchronisation of the falling edge appearing at the output of the AND-gate 85 with the time base signal that the interference voltages originating from this time base signal, which superimpose on the output signal of the time-to-amplitude converter circuit 14 and are therefore also taken over by the sample-and-hold circuit 17, enter into each measurement value with the same amplitude and are therefore eliminated during the subsequent subtraction.

The logic 1 appearing at the output of the AND-gate 89 is beyond that applied through the OR-gate 87 to the resetting input of the flip-flop 87, which is reset thereby. The logic 0 appearing hereby at its Q-output at first remains without effect, since the AND-gate 85 at its other input likewise receives a logic 0.

The logic 1, which is present at the output of the AND-gate 89, is at first suppressed by the AND-gate 94 until the $Q_C$-output of the 10:1 divider 81 again gives off a logic 1 for the first time after the just described operations. This is the case after eight further periods of the 15 MegaHertz time base signal and, since it is made certain through the reset flip-flop 86 that the logic 0 present at the output of the AND-gate 85 is retained, the 10:1 divider 81 and the 4-bit binary counter 82 can now be reset through the OR-gate 92 by the logic 1 given off by the AND-gate 94. In that case, the delay member 93 takes care that this resetting signal, which through the OR-gate 96 also brings the flip-flop 95 into the rest state, possesses an adequate length.

The falling edge, which has previously arisen at the output of the AND-gate 85 on the resetting of the flip-flop 86, has moreover triggered a monoflop 97, which at its Q-output has generated a resetting pulse which is fed through the line 19 (see FIG. 1) to the resetting input of the time-to-amplitude converter circuit 14 and through the OR-gate 9 to the resetting input of the flip-flop 8 so that the entire analog part of the time measurement circuit according to the invention is ready for the next measurement operation.

In conclusion, it is still to be pointed out that when the individual measuring or reference pulse signals do not follow very rapidly one upon the other, the controllable switches, formed in the example of embodiment according to FIG. 2 by AND-gates 47 to 54, of the controllable delay arrangement 5 can advantageously also be realised by relays. Relays with a guaranteed life of $10^9$ switching operations are at disposal, which guarantees an adequate life duration. A substantial advantage of this arrangement consists in that a complete potential separation takes place so that no reflections can appear at circuit parts which although switched off in principle, are however yet not completely separated one from the other. These reflections have the consequence on the use of AND-gates as controllable switches that the individual delay members in the case of actually equal signal transit times deliver different delay values in dependence on their position within the delay chain. Since, however, as already mentioned, deviations from the unit delay $\tau_0$ of $\pm 30\%$ can readily be accepted in the case of the initially named accuracies, the replacement of the AND-gates 47 to 54 through relays would be necessary at most for still greater demanded accuracies.

Under the control of central arithmetic and run-down control unit 3 the above described functions of the individual circuits are preferably performed in a certain sequence resulting in the following operational cycle:

For sake of simplicity here again is assumed that the apparatus according to the invention is operated as part of a distance measuring apparatus, measuring the times of travel of individual short light pulses to a target and therefrom back to the apparatus, and comparing these times of travel with also measured times of travel of reference light pulses forwarded inside the apparatus, said comparison comprising a subtraction of reference pulse transit time measurement values from corresponding measuring pulse transit time measurement values.

At the beginning of a complete operational cycle central unit 3 provides a master reset signal setting all circuits to their initial state.

Thereafter a first trigger signal is generated by central unit 3 and is applied to input E1 of start-stop control 35 in order to initiate a first type calibration measurement. In reaction thereon start-stop control 35 provides simultaneously a signal at each of its two outputs, both these signals being synchronised with, for example a rising pulse edge of the time base signal. The one of these two output signals is used to start the time-to-amplitude converter circuit 14 whereas the other one is used to trigger second counting circuit 37 which counts the subsequent rising edges of the time base signal up to three and generates a stop signal for said time-to-amplitude converter circuit 14 at the end of the third waveform period of the time base signal. Consequently, the time-to-amplitude converter circuit 14 outputs an analog signal, the amplitude of which corresponds to three period lengths of the time base signal and represents a first calibration value defining a first calibration point on the characteristic curve of the time-to-amplitude converter circuit 14.

Under control of intermediate storage control 10 this analog value is taken over by sample-and-hold circuit 17 intermediately storing it until analog-digital converter 22 has completed digitalization of this value and the corresponding digital value has been transferred on line 23 to central unit 3 for further storage and processing. Thereafter, all above named circuits are reset again.

As a second step the generation of a measuring pulse signal is initiated by control unit 3 by providing a command signal on line 27 for flip-flop 26 which in synchronism with the next following rising edge of the time base signal generates a trigger signal for the generator or transmitter which, in response thereto, generates a light pulse; the trigger signal provided by flip-flop 26 is also used to start main counter 32 which starts to count the subsequent rising edges of the time base signal in order to provide a measuring pulse signal transit time coarse measurement value for the light pulse being generated. At the same time central unit 3 provides on line 30 a signal indicating whether this light pulse is to be used as a measuring or as a reference light pulse. For the present step, it is assumed that the light pulse is used as measuring light pulse. This means that it travels to the target and therefrom back to a receiver which, in reaction on its receipt generates an output signal which is fed to input E of the apparatus according to the invention.

From input E this signal is fed to controllable delay arrangement 6 which has, for example, received such control signals from central unit 3 on line 7 that at the moment under consideration AND-gate 47 is enabled whereas all other AND-gates 48 to 54 are disabled. As a consequence, the signal fed to the input port of controllable delay arrangement 5 is forwarded to the output port thereof with almost no additional delay. Therefrom it is fed to the clock input of flip-flop 8 which is thereby set and generates a rising edge at its Q-output which rising edge is used as time-significant signal for starting a precision transit time measurement. This is done by feeding the time-significant signal on the one hand to the start input of time-to-amplitude converter circuit 14 and on the other hand to the enable input of first counting circuit 15 which thereupon starts counting the subsequent rising edges of the time base signal up to four. In synchronism with the fourth counted rising edge, i.e. at the end of the third waveform period following the generation of the time-significant signal, first counting circuit 15 generates a stop signal for the time-to-amplitude converter circuit 14, the analog output signal of which now represents a first measuring pulse signal transit time precision measurement value which again is intermediately stored, digitalized and transferred to control unit 3 as above described. The output signal of first counting circuit 15 is also used for disabling main counter 32 which thereby terminates counting of the rising edges of the time base signal. The resulting count is also transferred to control unit 3 and becomes there stored as measuring pulse signal transit time coarse measurement value for further processing.

After resetting of all circuits which were activated in the second step the central unit 3 provides a second trigger signal which is applied to input E2 of start-stop control 35 in order to initiate a second type calibration measurement as a third step of the operational cycle. In response to this trigger signal at E2 start-stop control 35 provides a signal at each of its two outputs which both signals are synchronised with a respective rising edge of the time base signal but are spaced apart from one another by one period length of the time base signal. The earlier one of these two signals is again used as start signal for the time-to-amplitude converter circuit 14, whereas the later one is again used to trigger the second counting circuit 37, which again counts the subsequent rising edges of the time base signal up to three and generates a stop signal for the time-to-amplitude converter circuit 14 in synchronism with the end of the third waveform period. In this case, however, the time-to-amplitude converter circuit 14 is operating for four period lengths because of the time distance of the two output signals of the start-stop control 35. This means that the corresponding analog output signal of the time-to-amplitude converter circuit 14, which signal is further processed according to the above described first step, represents a second calibration value defining a second calibration point on the characteristic curve of the time-to-amplitude converter circuit 14, which second calibration point together with the first calibration point can be used for a linear interpolation.

After resetting of the circuits having been active, a fourth step is initiated by control unit 3 which step is identical to the second step except that the signal delivered on line 30 commands the generated light pulse to be used as reference light pulse which is forwarded inside the apparatus along a reference light path directly to the receiver. Therefore, this reference light pulse generally has a time of travel which is different from that of the previously generated measuring light pulse. As a consequence, the now obtained reference pulse signal transit time coarse and precision measurement values will generally be different from the measuring pulse signal transit time measurement values obtained at the above second step. It is to be pointed out that at the presently considered fourth step the same AND-gate 47 of controllable delay arrangement 5 is enabled, so that this reference pulse signal undergoes the same additional "zero"-delay as the measuring pulse signal of step two.

After a master reset for all circuits a fifth step is performed which comprises a first type calibration measurement identical to that of the first step.

At a sixth step again a measuring pulse signal is provided and the respective measuring transit time is measured similar to step two. Thereby is assumed that the transit time of the measuring pulse signal has not changed since the second step. Therefore, it is not necessary to start again main counter 32, since the coarse measurement value will still be the same. The important difference with respect to the second step is, that, according to the invention, the controllable delay arrangement is provided with a control signal on line 7, shifting Johnson counter 56 to provide a logic 1 at its $Q_1$-output so that now AND-gate 48 is enabled, whereas AND-gate 47 as well as AND-gates 49 to 54 are blocked. This means that now the signal fed to the input port of controllable delay arrangement 5 undergoes an additional delay $\tau_O$ provided by delay member 40 before it reaches the output port and triggers generation of the respective time-significant signal by setting flip-flop 8. In other words: If at the second step of the operational cycle a measuring pulse signal transit time precision measurement value $t_M$ was obtained, now a value $t_M + \tau_O$ is measured inspite of the fact that the measuring transit time has not changed.

The seventh step is again a second type calibration measurement identical to above step three.

The eighth step is a further reference pulse signal transit time measurement whereby AND-gate 48 is still activated so that now a reference pulse signal transit time precision measurement value of $t_R + \tau_O$ is obtained when the corresponding value which was obtained at step four is designated by $t_R$.

The above steps are repeated by imparting additional delays $2\cdot\tau_O, 3\cdot\tau_O \ldots (n-1)\cdot\tau_O$ until n, for example eight measuring pulse signal transit time precision measurement values $t_M; t_M + \tau_O; t_M + 2\tau_O; \ldots; t_M + 7\tau_O$ and n, for example eight reference pulse signal transit time precision measurement values $t_R; t_R + \tau_O; t_R + 2\tau_O; \ldots; t_R + 7\tau_O$ are obtained.

Each of these eight measuring pulse signal measurement values comprises a different error resulting from the non-linearity of the characteristic curve of the time-to-amplitude converter circuit 14 in the calibrated range between the two calibration points. Therefore, if now the mean value of the above eight measuring pulse signal precision measurement values is taken, these eight different errors altogether are comprised in this average value. Since the different delays $0\cdot\tau_O, \ldots, (n-1)\tau_O$ are about uniformly spaced over the calibrated range between the two calibration points, all possible different errors are about uniformly comprised in the average value. The same is true for the average value taken of the obtained reference pulse signal transit time precision measurement values, which average value becomes subtracted from the corresponding average value for the measuring pulse signals so that the nonlinearity errors cancel out each other to a very high degree of accuracy. The same is true if each reference pulse signal precision measurement value is directly subtracted from the corresponding measuring pulse signal precision measurement value and an average value is taken from these differences. From the obtained calibration values of the first type an average value is taken as well as from the calibration values of the second type and these two average values are used to compute the steepness of a straight interpolation line between the two calibration points, from which steepness the time value corresponding to each output signal value of the time-to-amplitude converter circuit 14 can be calculated. After termination of the above described operational cycle a new cycle can be started for obtaining a second transit time difference value.

According to the invention the above operational cycle can be modified in that at first n measuring pulse signal transit time measurements and then n reference pulse signal transit time measurements are performed. If a time-to-amplitude converter circuit 14 is available which has a highly constant characteristic curve it is not necessary to perform a calibration measurement between each pair of transit time measurements.

We claim:

1. A method of determining the difference between the transit times of measuring pulse signals of short duration being generated by a signal generating means and being forwarded therefrom towards a signal receiving means along a measuring signal path which establishes for said measuring pulse signals an unknown time of travel being representative for a physical quantity of interest, and the transit times of reference pulse signals of short duration being also generated by said signal generating means and being forwarded therefrom toward said signal receiving means along a reference signal path which establishes for said reference pulse signals a known constant time of travel, said signal receiving means generating on receipt of each of said measuring and reference pulse signals a time-significant output signal which, for measuring the respective transit time, is supplied to a time measuring device which comprises a coarse transit time measuring means and a precision transit time measuring means comprising a precision transit time measurement control means and a time-to-amplitude converter circuit which is controlled thereby and provides an analog output signal the absolute magnitude of which, after receipt of each of said time-significant signals starts to increase with time from a zero value until a stop signal is supplied to said time-to-amplitude converter circuit, said method comprising the steps:

of generating a periodical time base signal having a highly constant frequency, of calibrating said time-to-amplitude converter circuit by measuring the increase of the amplitude of its output signal during a calibration time span having a defined length which is at least equal to the length of one waveform period of said time base signal, of generating in synchronism with said time base signal n measuring pulse signals within a period of time during which the magnitude of said unknown transit time established by said measuring signal path does not change, and of generating in synchronism with said time base signal n reference pulse signals, the period of time during which said n measuring pulse signals and said n reference pulse signals are generated, being so short that the magnitudes of the response times of said signal generating means and of said signal receiving means do not change, of imparting to each of at least n−1 of said n measuring pulse signals and to each of at least n−1 of said n reference pulse signals an individual additional predetermined delay before the corresponding time-significant signal is generated, the magnitudes of said at least n−1 delays for said at least n−1 measuring pulse signals being all different from one another and the magnitude of the longest of these delays being smaller than said defined length of said calibration time span, and the magnitudes of said at least n−1 delays for said at least n−1 reference pulse signals being all different from one another and the magnitude of the longest of these delays being smaller than said defined length of said calibration time span, of obtaining for each of said n measuring pulse signals and each of said n reference pulse signals a precision transit time measurement value by forwarding to said time-to-amplitude converter circuit a start signal in response to the generation of a respective time-significant signal and by stopping said time-to-amplitude converter circuit in synchronism with the end of a predetermined waveform period of said time-base signal occurring after said respective time-significant signal, of providing an intermediate storing equipment for intermediately storing the thereby obtained n measuring pulse signal precision transit time measurement values and n reference pulse signal precision transit time measurement values, of obtaining for at least one of said n measure pulse signals and for at least one of said n reference pulse signals a respective coarse transit time measurement value by counting the waveform periods of said time base signal occurring between the waveform period to which the generation of said at least one measuring pulse signal is in synchronism and said predetermined subsequent waveform period at the end of which the corresponding precision transit time measurement is stopped, and by counting the waveform periods of said time base signal occurring between the waveform period to which the generation of said at least one reference pulse signal is in synchronism and said defined subsequent waveform period at the end of which the corresponding precision transit time measurement is stopped, respectively, and of calculating the transit time difference of interest from the difference between said at least two coarse transit time measurement values and an average difference between said n measuring pulse signal precision transit time measurement values and said n reference pulse/signal precision transit time measurement values.

2. A method as claimed in claim 1,
wherein for each of said at least n−1 additionally delayed measuring pulse signals a corresponding one of said at least n−1 additionally delayed reference pulse signals is provided the additional delay of which has the same magnitude.

3. A method as claimed in claim 2,
wherein to one of said n measuring pulse signals and to one of said n reference pulse signals no additional time delay is imparted,
wherein to a second one of said n measuring pulse signals and to a second one of said n reference pulse signals an additional time delay of $\tau_o$ is imparted,
wherein to a third one of said n measuring pulse signals and to a third one of said n reference pulse signals an additional time delay of $2\tau_o$ is imparted and so on,
wherein the longest time delay, which is imparted to one of said n measuring pulse signals and also to one of said reference pulse signals is $(n-1)\tau_o$, and
wherein n and $\tau_o$ are so selected that $n\cdot\tau_o$ is about equal to said calibration time span.

4. A method as claimed in claim 1,
wherein the step of generating said n measuring pulse signals and said n reference pulse signals comprises generation of n measuring pulse signals directly one after the other and generation of n reference pulse signals directly one after the other.

5. A method as claimed in claim 4,
wherein the generation of said n measuring pulse signals and of said n reference pulse signals is so controlled in time that said time-to-amplitude converter circuit is operated periodically.

6. A method as claimed in claim 1,
wherein the step of generating said n measuring pulse signals and said n reference pulse signals comprises n times alternately generating one measuring pulse signal and one reference pulse signal.

7. A method as claimed in claim 1,
wherein the generation of said time base signal is controlled by a quartz and
wherein the calibration of said time-to-amplitude converter circuit is performed by using the waveform period length of said quartz controlled time base signal as a standard of comparison.

8. A method as claimed in claim 7,
wherein the step of calibrating said time-to-amplitude converter circuit by using the waveform period length of said quartz controlled time base signal as a standard of comparison comprises:

performing a first type calibration measurement by starting said time-to-amplitude converter circuit in synchronism with the beginning of an arbitrarily selected wave form period of said time base signal, counting the waveform periods of said time base signal occurring after said arbitrarily selected waveform period, stopping said time-to-amplitude converter circuit in synchronism with the end of the m-th counted waveform period and intermediately storing the thereby obtained amplitude value of the analog output signal of said time-to-amplitude converter circuit as a first calibration value by means of said intermediate storing equipment, resetting said time-to-amplitude converter circuit to said zero value, performing thereafter a second type calibration measurement by starting said time-to-amplitude converter circuit in synchronism with the beginning of a second arbitrarily selected waveform period of said time base signal, counting the waveform periods of said time base signal occurring after said second arbitrarily selected waveform period, stopping said time-to-amplitude converter circuit in snychronism with the end of the $(m+\mu)$-th counted waveform period, and by intermediately storing the thereby obtained amplitude value of the analog output signal of said time-to-amplitude converter circuit as a second calibration value by means of said intermediate storing equipment, determining the average steepness of the characteristic curve of said time-to-amplitude converter circuit in a calibrated range between two calibration points which are defined by said first and said second calibration values by subtracting said first from said second calibration value and dividing this difference by the number $\mu$ of waveform periods multiplied by the waveform period length of said time base signal, and wherein the step of obtaining for each of said n measuring pulse signals and for each of said n reference pulse signals a precision transit time measurement value comprises counting the waveform periods of said time base signal occurring after the generation of the corresponding time-significant signal and stopping said time-to-amplitude converter circuit in synchronism with the beginning of the $(m+\mu)$-th counted waveform period.

9. A method as claimed in claim 8,
wherein m is selected to be equal to 3 and $\mu$ is selected to be equal to 1.

10. A method as claimed in claim 9,
wherein the step of generating said n measuring pulse signals and of generating said n reference pulse signals comprises n times alternately generating one measuring pulse signal and one reference pulse signal,
wherein the step of calibrating said time-to-amplitude converter circuit further comprises performing a first type calibration measurement before (or after) the generation of each measuring pulse signal and performing a second type calibration measurement before (or after) the generation of each reference pulse signal, and
wherein the generation of said n measuring pulse signals and of said n reference pulse signals as well as the starting of said n first type calibration measurements and of said n second type calibration measurements are so controlled in time that said time-to-amplitude converter circuit and said intermediate storing equipment are operated periodically and rigidly in phase with said time base signal.

11. An apparatus for determining the difference between the transit times of measuring pulse signals of short duration being generated by a signal generating means and being forwarded therefrom along a measuring signal path which establishes for said measuring pulse signals an unknown time of travel being representative for a physical quantity of interest, and the transit times of reference pulse signals of short duration being also generated by said signal generating means and being forwarded therefrom along a reference signal path which establishes for said reference pulse signals a known constant time of travel, said apparatus comprising a signal receiving means for receiving said measuring pulse signals from said measuring signal path as well as said reference pulse signals from said reference signal path, and for generating on receipt of each of said measuring and reference pulse signals a time-significant output signal, and a time measuring device to which said time-significant output signals are supplied for measurement of the respective transit times, said time measuring device comprising a coarse transit time measuring means and a precision transit time measuring means consisting of a precision transit time measurement control means and of a time-to-amplitude converter circuit which is controlled by said control means and to which said time-significant signals are fed as start signals, said time-to-amplitude converter circuit providing an analog output signal the absolute magnitude of which, after receipt of each start signal, starts to increase with time from a zero value until a stop signal is supplied to said time-to-amplitude converter circuit, and wherein said apparatus further comprises:

an oscillator means for generating a periodical time base signal having a highly constant frequency, a calibrating means for calibrating said time-to-amplitude converter circuit by measuring the increase of the amplitude of its output signal during a calibration time span having a defined length which is at least equal to the length of one waveform period of said time base signal, a control means for generating in synchronism with said time base signal n measuring pulse signals within a period of time during which the magnitude of said unknown transit time established by said measuring signal path does not change, and for generating in synchronism with said time base signal n reference pulse signals, the period of time during which said n measuring pulse signals and said n reference pulse signals are generated, being so short that the magnitudes of the response times of said signal generating means and of said signal receiving means do not change, a controllable delay means for imparting to each of at least $n-1$ of said n measuring pulse signals and to each of at least $n-1$ of said n reference pulse signals an individual additional predetermined delay before the corresponding time-significant signal is generated, the magnitudes of said at least $n-1$ delays for said at least $n-1$ measuring pulse signals being all different from one another and the magnitude of the longest of these delays being smaller than said defined length of said calibration time span, and the magnitudes of said at least $n-1$ delays for said at least $n-1$ reference pulse signals being all different from one another and the magnitude of the longest of these delays being smaller than said defined length of said calibration time span, wherein said precision transit time measurement control means is adapted to obtain for each of said n measuring pulse signals and each of said n reference pulse signals a precision transit time measurement value by forwarding to said time-to-amplitude converter circuit a start signal on receipt of a respective time-significant signal and by stopping said time-to-amplitude converter circuit in synchronism with the end of a predetermined waveform period of said time base signal occurring after said respective time-significant signal, wherein said apparatus further comprises an intermediate storing equipment for intermediately storing the thereby obtained n measuring pulse signal precision transit time measurement values and n reference pulse signal precision transit time measurement values, wherein said coarse time measuring means is adapted to obtain for at least one of said n measuring pulse signals and for at least one of said n reference pulse signals a respective coarse transit time measurement value by counting the waveform periods of said time base signal occurring between the waveform period to which the generation of said at least one measuring pulse signal is in synchronism and said predetermined subsequent waveform period at the end of which the corresponding precision transit time measurement is stopped, and by counting the waveform periods of said time base signal occurring between the waveform period to which the generation of said at least one reference pulse signal is in synchronism and said defined subsequent waveform period at the end of which the corresponding precision transit time measurement is stopped, respectively, and wherein said apparatus further comprises a calculating means for calculating the transit time difference of interest from the difference between said at least two coarse transit time measurment vaules and an average difference between said n measuring pulse signal precision transit time measurment values and said n reference pulse precision transit time measurment values, and a central sequence control means.

12. An apparatus as claimed in claim 11,
wherein said controllable delay means has an input port to which said n measuring pulse signals and said n reference pulse signals are supplied and an output port,
wherein said controllable delay means comprises n−1, delay members each providing a delay of about the same magnitude $\tau_o$ and each having a signal input and a signal output, the signal input of a first one of said delay members being connected to said input port of said controllable delay means, whereas its signal output is connected to the signal input of a second one of said delay members, the signal output of which is connected to the signal input of a third one and so on,
wherein said controllable delay means further comprises n switches, each having a control input, a signal input and a signal output, the signal outputs of all said n switches being connected to said output port of said controllable delay means, the signal input of a first one of said
switches being connected to said input port of said controllable delay means for providing a first signal path establishing no additional delay between said input port and said output port when the control input of this first switch is enabled, the signal input of a second one of said switches being connected to the signal output of said first delay member for providing a second signal path establishing an additional delay of $\tau_o$ between said input port and said output port, when the control input of said second switch is enabled, the signal input of a third one of said switches being connected to the signal output of said second delay member for providing a third signal path establishing an additional delay of $2\tau_o$ between said input port and said output port when the control input of said third switch is enabled, and so on, the signal input of a n-th one of said switches being connected to the signal output of said (2−1)-th delay member for providing a n-th signal path establishing an additional delay of $(n-1)\tau_o$ between said input port and said output port when the control input of said n-th switch is enabled,
whereby n and $\tau_o$ are so selected that $n\cdot\tau_o$ is about equal to said calibration time span.

13. An apparatus as claimed in claim 12, wherein each of said n−1 delay members comprises several gates arranged in series connection to each other, the inputs of each gate being connected to each other and to the output of a preceding gate, and
wherein each of said n switches is an AND gate having two inputs.

14. An apparatus as claimed in claim 12,
wherein a Johnson counter is provided having a clock input and comprising n stages the output of each of which is connected to the control input of one of said n switches.

15. An apparatus as claimed in claim 14,
wherein said n measuring pulse signals are generated one after the other and said reference pulse signals are generated one after the other and wherein the clock input of said Johnson counter is supplied with a clock signal for each of said n measuring pulse signals for providing one undelayed time-significant signal and n−1 time-significant signals having an individual delay, and said clock input also being supplied with a clock signal for each of said n reference pulse signals for providing one undelayed time-significant signal and n−1 time-significant signals having an individual additional delay.

16. An apparatus as claimed in claim 14,
wherein n times alternately one measuring pulse and one reference pulse are generated, and
wherein the clock input of said Johnson counter is supplied with a clock signal for each pair of a measuring and a reference pulse signal for providing two undelayed time-significant signals the one for a measuring pulse signal and the other one for a reference pulse signal and two times n−1 time significant signals having an individual time delay for said n−1 measuring pulse signals and said n−1 reference pulse signals, respectively.

17. An apparatus as claimed in claim 12,
wherein said input port of said controllable delay means is connected to a signal output of said signal receiving means and wherein said output port of said controllable delay means is connected to a signal input of said time measuring means.

18. An apparatus as claimed in claim 11,
wherein said precision transit time measurement control means comprises
an entrance flip-flop being settable on receipt of a delayed measuring or reference pulse signal and providing thereupon a time-significant signal for starting said time-to-amplitude converter circuit, and
a first counting means having an enable input which also receives said time-significant signal from said entrance flip-flop, a clock input to which said time base signal is supplied and a stop signal output providing a stop signal for said time-to-amplitude converter circuit, said first counting means being adapted to count the waveform periods of said time base signal occurring after it has been enabled by a time-significant signal from said entrance flip-flop and to generate a stop signal in synchronism with the beginning of a predetermined counted waveform period of said time base signal.

19. An apparatus as claimed in claim 18,
wherein said first counting means comprises a predetermined number of D-flip-flops connected in series one behind the other so that the Q-output of each preceding D-flip-flop is connected to the D-input of the following D-flip-flop, the D-input of the first one of that D-flip-flops being connected to receive said time-significant signal from said entrance flip-flop, and the Q-output of the last one of the D-flip-flops providing said stop signal for said time-to-amplitude converter circuit, and all clock inputs of said D-flip-flops being supplied with said time base signal.

20. An apparatus as claimed in claim 19,
wherein said calibrating means comprises a start-stop control circuit with two trigger inputs, a reset input, a clock input, a start output and a stop output, and a second counting means with an enable input, a clock input and a stop signal output, said trigger inputs and said reset input being connected to said sequence control for receiving first and second trigger signals and reset signals therefrom, said clock inputs being connected to receive said time base signal, said start output of said start-stop control circuit providing start signals for said time-to-amplitude converter circuit, said stop output of said start-stop control circuit being connected to said enable input of said second counting means, the stop signal output of which provides stop signals for said time-to-amplitude converter circuit, and wherein said start-stop control circuit is adapted to provide simultaneously and in synchronism with the beginning of a waveform period of said time base signal an output signal at its start output and at its stop output after being triggered at a first one of its two trigger inputs, and to provide in synchronism with the beginning of a waveform period of said time base signal an output signal at its start output and in synchronism with the beginning of a $\mu$-th subsequent waveform period of said time base signal at its stop output, and said second counting means being adapted to count said waveform periods of said time base signal and to provide a stop signal at its stop signal output at the end of the m-th counted waveform period after having received an enable signal from the stop output of said start-stop control circuit.

21. An apparatus as claimed in claim 19 wherein said second counting means comprises m D-flip-flops connected in series one behind the other, so that the Q-ouput of each preceding D-flip-flop is connected to the D-input of the following D-flip-flop, the D-input of the first one of said m D-flip-flops being connected to receive said start signals from said start-stop control circuit and the Q-output of the last one of said D-flip-flops being the stop signal output of said second counting means, and all clock inputs of said m D-flip-flops being supplied with said time base signal.

22. An apparatus as claimed in claim 21, wherein m is selected to be equal to 3, $\mu$ is selected to be equal to 1 and wherein the predetermined number of D-flip-flops of said first counting means is equal to 4, so that said stop signal for said time-to-amplitude converter circuit is generated at the beginning of the 4-th waveform period of said time base signal occurring after the generation of said time-significant signal by said entrance flip-flop.

23. An apparatus as claimed in claim 22, wherein between said stop signal output of said second counting means and the stop input of said time-to-amplitude converter circuit a delay member is arranged establishing a delay which is about equal to the response time of said first one of said D-flip-flops of said first counting means, said first one of said D-flip-flops not being able to react on a signal which is supplied to its clock input before said response time has elapsed after application of an enable signal to said first D-flip-flop from said entrance flip-flop.

* * * * *